(12) United States Patent
Ikemoto et al.

(10) Patent No.: US 8,659,120 B2
(45) Date of Patent: Feb. 25, 2014

(54) SEMICONDUCTOR DEVICE SUBSTRATE AND SEMICONDUCTOR DEVICE

(75) Inventors: Yoshihiko Ikemoto, Yokohama (JP); Atsushi Kikuchi, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 95 days.

(21) Appl. No.: 13/173,907

(22) Filed: Jun. 30, 2011

(65) Prior Publication Data

US 2012/0098091 A1 Apr. 26, 2012

(30) Foreign Application Priority Data

Oct. 25, 2010 (JP) ................................ 2010-238597

(51) Int. Cl.
*H01L 29/02* (2006.01)
*H01L 23/48* (2006.01)

(52) U.S. Cl.
USPC .................. 257/532; 257/774; 257/E23.011; 257/E29.002

(58) Field of Classification Search
USPC .................. 257/532, 774, E23.011, E29.002
See application file for complete search history.

(56) References Cited

U.S. PATENT DOCUMENTS

| 2008/0290495 | A1 | 11/2008 | Uematsu et al. |
| 2009/0140400 | A1 | 6/2009 | Amey, Jr. et al. |
| 2009/0200069 | A1* | 8/2009 | Kariya et al. ............. 174/255 |
| 2009/0290316 | A1* | 11/2009 | Kariya ....................... 361/767 |

FOREIGN PATENT DOCUMENTS

| JP | 2008-227387 A | 9/2008 |
| JP | 2009-200470 A | 9/2009 |

\* cited by examiner

*Primary Examiner* — Whitney T Moore
(74) *Attorney, Agent, or Firm* — Westerman, Hattori, Daniels & Adrian, LLP

(57) ABSTRACT

There is provided a semiconductor device substrate including: a multi-layer wiring layer; a first capacitor pad which is provided on an uppermost layer of the multi-layer wiring layer, and which includes a first power supply pad connected to a power supply layer of the multi-layer wiring layer through a first via and a first ground pad connected to a ground layer of the multi-layer wiring layer through a second via; and a second capacitor pad which is provided on the uppermost layer of the multi-layer wiring layer, and which includes a second power supply pad connected to the first power supply pad through a first wire and a second ground pad connected to the first ground pad through a second wire.

20 Claims, 37 Drawing Sheets

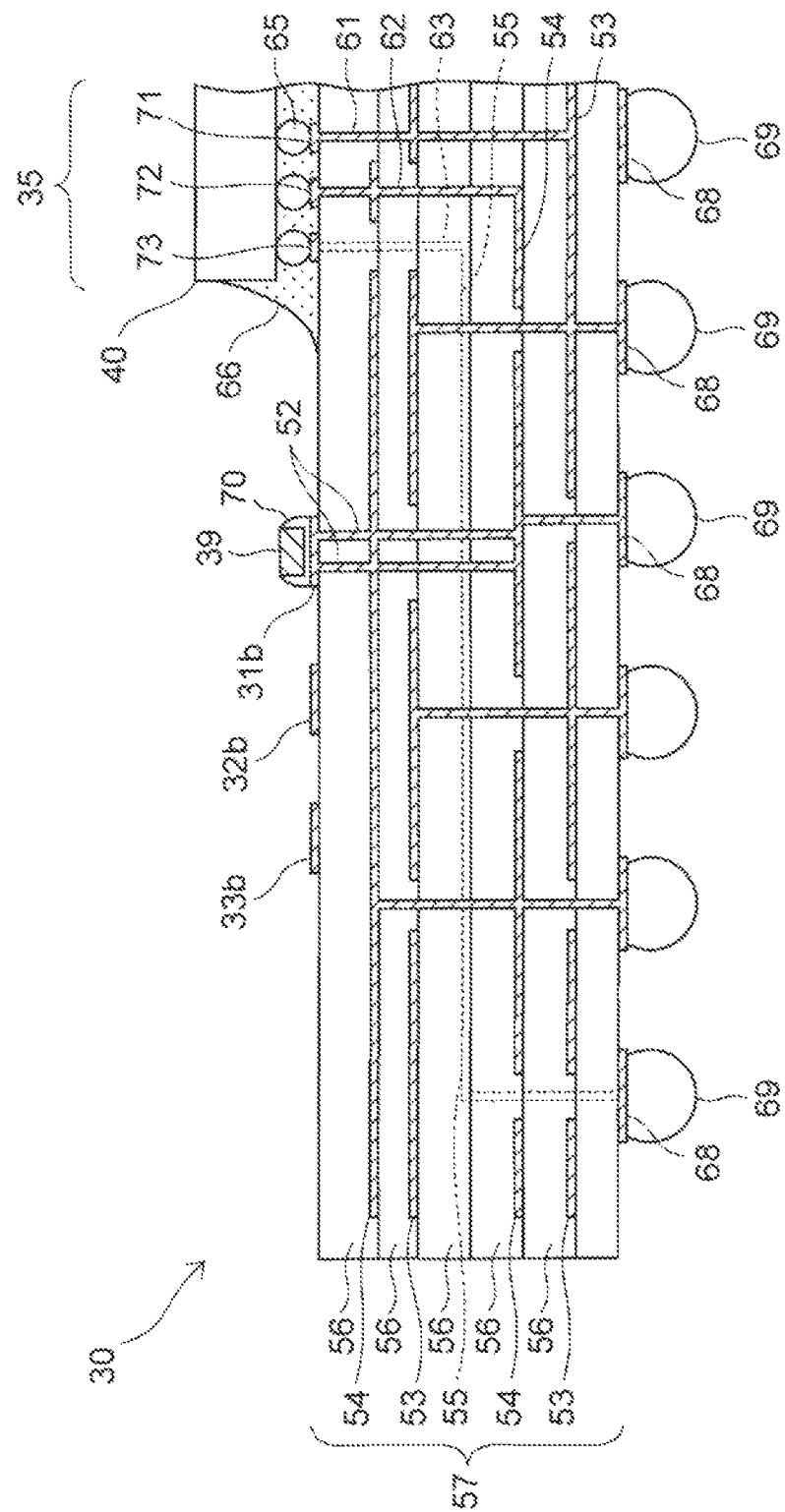

FIG. 29
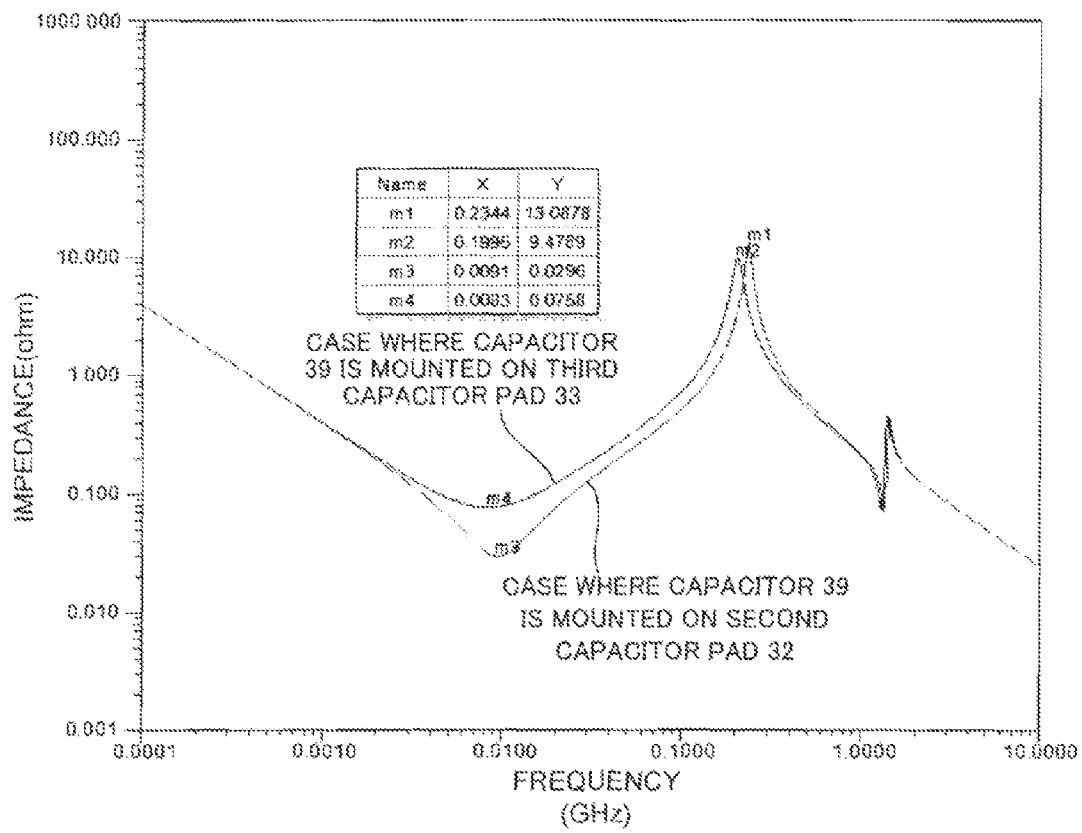
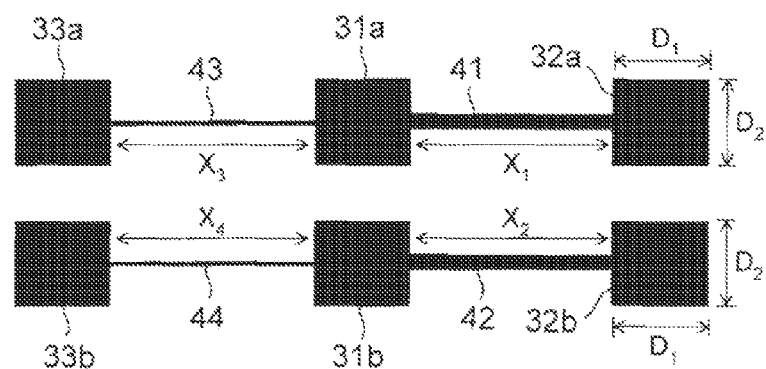

SEMICONDUCTOR DEVICE SUBSTRATE AND SEMICONDUCTOR DEVICE

CROSS-REFERENCE TO RELATED APPLICATIONS

This application is based upon and claims and the benefit of priority of the prior Japanese Patent Application No. 2010-238597, filed Oct. 25, 2010, the entire contents of which are incorporated herein by reference.

FIELD

The embodiments discussed herein relate to a semiconductor device substrate and a semiconductor device.

BACKGROUND

Various semiconductor devices are mounted in an electronic apparatus. The semiconductor devices each include a semiconductor element which performs various calculations and a semiconductor device substrate for supplying power and signals to the semiconductor element.

Power supply to the semiconductor element is performed using a ground pattern and a power supply pattern provided in the semiconductor device substrate. However, if the potentials of these patterns, or the power supply voltage, fluctuate, the semiconductor element malfunctions.

Thus, in such a type of semiconductor device substrate, a decoupling capacitor is provided between the ground pattern and the power supply pattern, and the fluctuation of the power supply voltage is absorbed by the decoupling capacitor to stabilize the power supply voltage.

In a case where the decoupling capacitor is provided as described above, it is preferable to reduce noise occurring in the semiconductor element and the semiconductor device substrate.

Patent Document 1: Japanese Laid-open Patent Publication No. 2009-200470
Patent Document 2: Japanese Laid-open Patent Publication No. 2008-227387

SUMMARY

According to an aspect of a disclosure below, there is provided a semiconductor device substrate including: a multi-layer wiring layer; a first capacitor pad which is provided on any one of an uppermost layer and a lowermost layer of the multi-layer wiring layer, and which includes a first power supply pad connected to a power supply layer of the multi-layer wiring layer through a first via and a first ground pad connected to a ground layer of the multi-layer wiring layer through a second via; a second capacitor pad which is provided on any one of the uppermost layer and the lowermost layer of the multi-layer wiring layer, and which includes a second power supply pad connected to the first power supply pad through a first wire and a second ground pad connected to the first ground pad through a second wire.

In addition, according to another aspect of the disclosure, there is provided a semiconductor device including: a semiconductor device substrate including a multi-layer wiring layer, a first capacitor pad which is provided on an uppermost layer of the multi-layer wiring layer, and which includes a first power supply pad connected to a power supply layer of the multi-layer wiring layer through a first via and a first ground pad connected to a ground layer of the multi-layer wiring layer through a second via, and a second capacitor pad which is provided on the uppermost layer of the multi-layer wiring layer, and which includes a second power supply pad connected to the first power supply pad through a first wire and a second ground pad connected to the first ground pad through a second wire; a capacitor connected to any one of the first capacitor pad and the second capacitor pad; and a semiconductor element disposed on the semiconductor device substrate.

Further, according to another aspect of the disclosure, there is provided a semiconductor device including: a semiconductor device substrate including a multi-layer wiring layer, a first capacitor pad which is provided on an uppermost layer of the multi-layer wiring layer, and which includes a first power supply pad connected to a power supply layer of the multi-layer wiring layer through a first via and a first ground pad connected to a ground layer of the multi-layer wiring layer through a second via, a second capacitor pad which is provided on the uppermost layer of the multi-layer wiring layer, and which includes a second power supply pad connected to the first power supply pad through a first wire and a second ground pad connected to a first ground pad through a second wire, and a third capacitor pad which is provided on the uppermost layer of the multi-layer wiring layer, and which includes a third power supply pad connected to the second power supply pad through a third wire and a third ground pad connected to the second ground pad through a fourth wire; a capacitor connected to any one of the first capacitor pad, the second capacitor pad, and the third capacitor pad; and a semiconductor element disposed on the semiconductor device substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 14 is an enlarged cross-sectional view of a main portion of a semiconductor device which is formed by mounting the capacitor and a semiconductor element on the semiconductor device substrate according to the first embodiment;

FIG. 29 illustrates impedance curves of the semiconductor device substrate according to the second embodiment which are obtained from the simulation;

DESCRIPTION OF EMBODIMENTS

Before describing the embodiments, a prelude serving as a basis will be described.

Figure 1A:
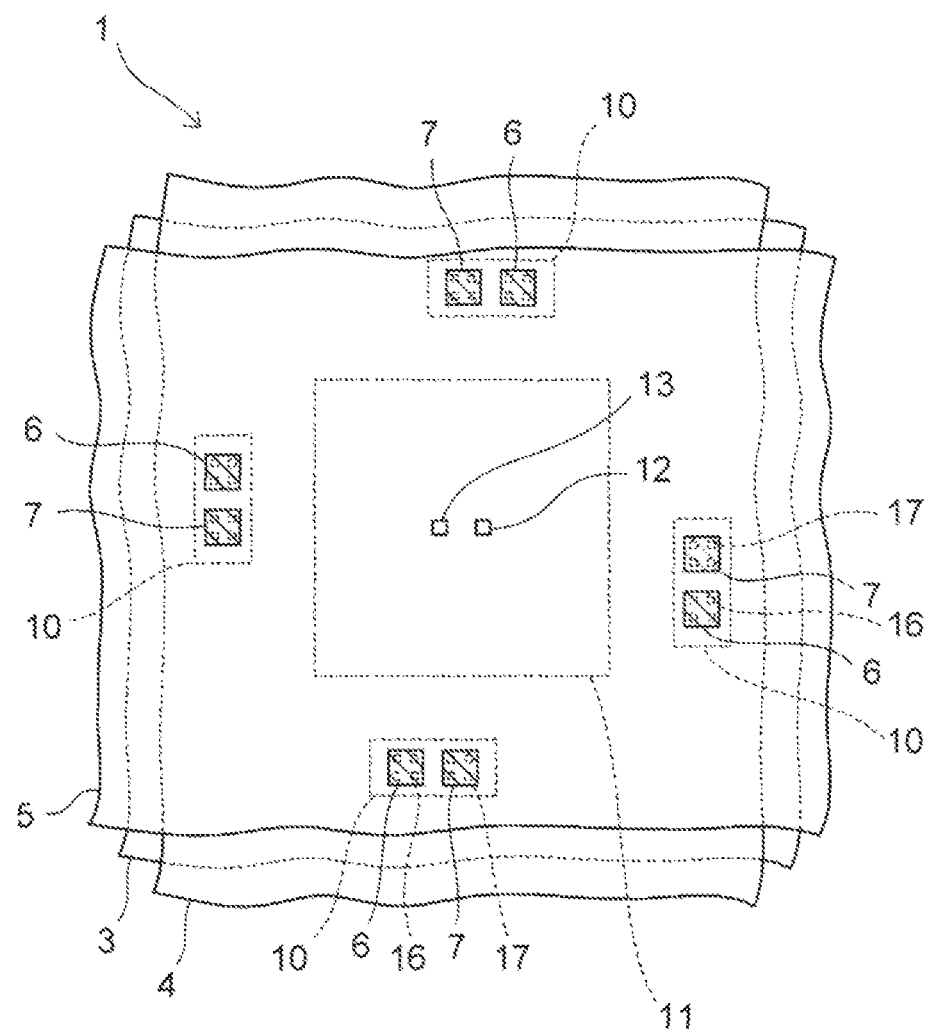
FIG. 1A is an enlarged plan view of a semiconductor device substrate according to a prelude.
Figure 1B:
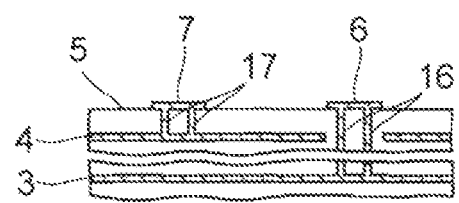
FIG. 1B is an enlarged cross-sectional view thereof.

FIG. 1A is an enlarged plan view of a semiconductor device substrate 1, and FIG. 1B is a cross-sectional view thereof.

As illustrated in FIGS. 1A and 1B, the semiconductor device substrate 1 includes a power supply layer 3, a ground layer 4, and an insulating layer 5.

A rectangular semiconductor element mounting region 11 is defined in the semiconductor device substrate 1, and a plurality of capacitor pads 10 are provided beside the four sides of the rectangle.

Each of the capacitor pads 10 is formed by patterning a copper plate film, and includes a power supply pad 6 and a ground pad 7.

Among them, the power supply pad 6 is electrically connected to the power supply layer 3 through first vias 16, and the ground pad 7 is electrically connected to the ground layer 4 through second vias 17.

Moreover, a power supply electrode 12 electrically connected to the power supply layer 3 and a ground electrode 13 electrically connected to the ground layer 4 are formed in the semiconductor element mounting region 11.

Note that, a plurality of power supply electrodes 12 and a plurality of ground electrodes 13 are formed in the semiconductor element mounting region 11. However, to simplify the drawing, only one power supply electrode 12 and one ground electrode 13 are illustrated in FIG. 1.

Figure 2:
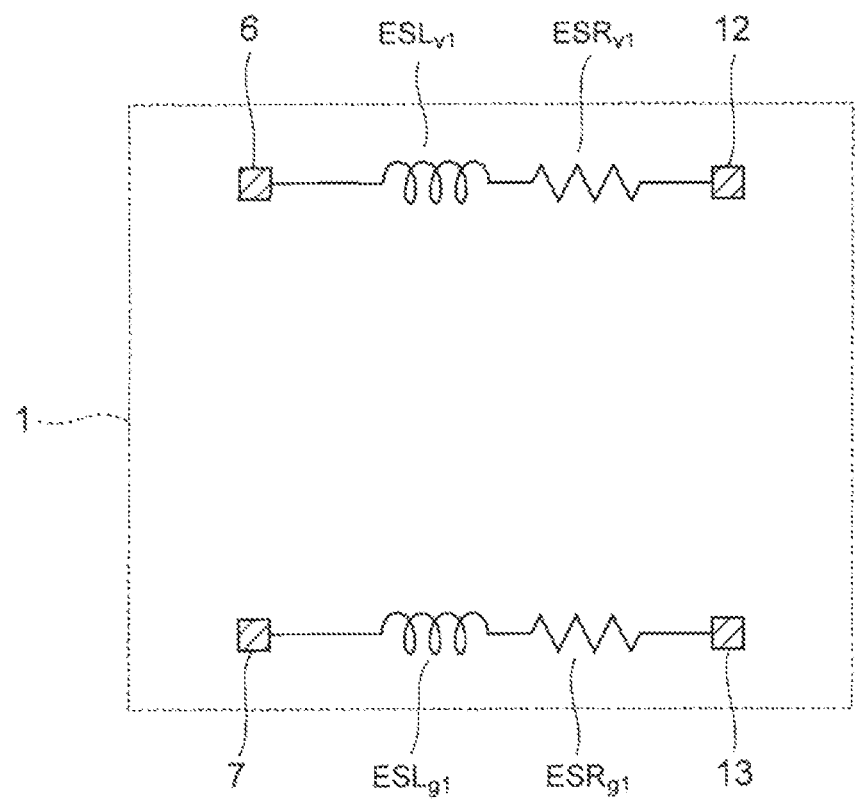
FIG. 2 is an equivalent circuit of the semiconductor device substrate according to the prelude.

FIG. 2 is a simple equivalent circuit of the semiconductor device substrate 1.

The semiconductor device substrate 1 includes various equivalent series inductances (ESLs) and equivalent series resistances (ESRs) corresponding to wiring paths therein.

For example, a first power supply side $ESL_{v1}$ and a first power supply side $ESR_{v1}$ attributable to a wiring path of the power supply layer 3, the first vias 16, and the like exist between the power supply pad 6 and the power supply electrode 12.

Similarly, a first ground side $ESL_{g1}$ and a first ground side $ESR_{g1}$ attributable to a wiring path of the ground layer 4, the second vias 17, and the like exist between the ground pad 7 and the ground electrode 13.

Note that, there is a capacitance between the power supply and the ground of the semiconductor device substrate. However, this capacitance is omitted from the equivalent circuit since this capacitance is sufficiently small compared to the capacitance of a capacitor and the effect thereof is small.

Figure 3:
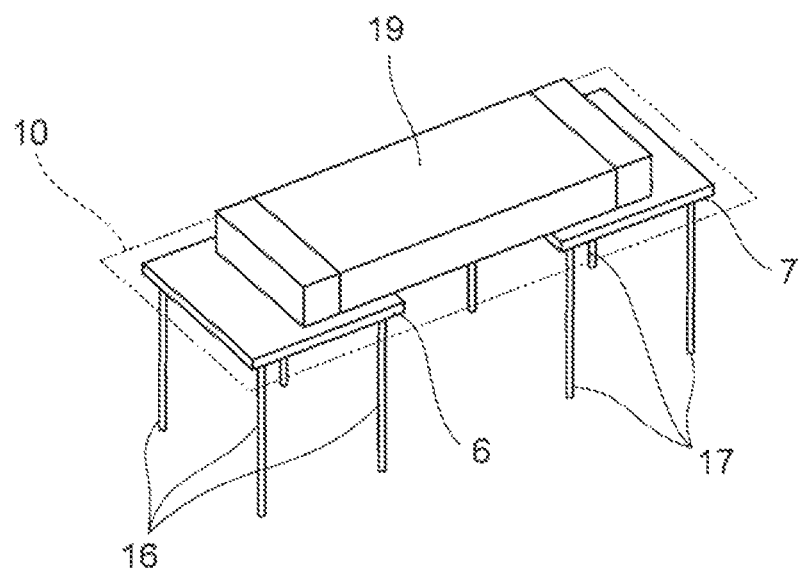
FIG. 3 is a perspective view of a capacitor mounted on the semiconductor device substrate according to the prelude.

FIG. 3 is a perspective view of a capacitor 19 to be mounted on each of the capacitor pads 10.

The capacitor 19 has both electrodes thereof soldered respectively to the power supply pad 6 and the ground pad 7, and functions as a decoupling capacitor which absorbs a fluctuation of a voltage between the layers 3, 4 (see FIG. 1A).

Figure 4:
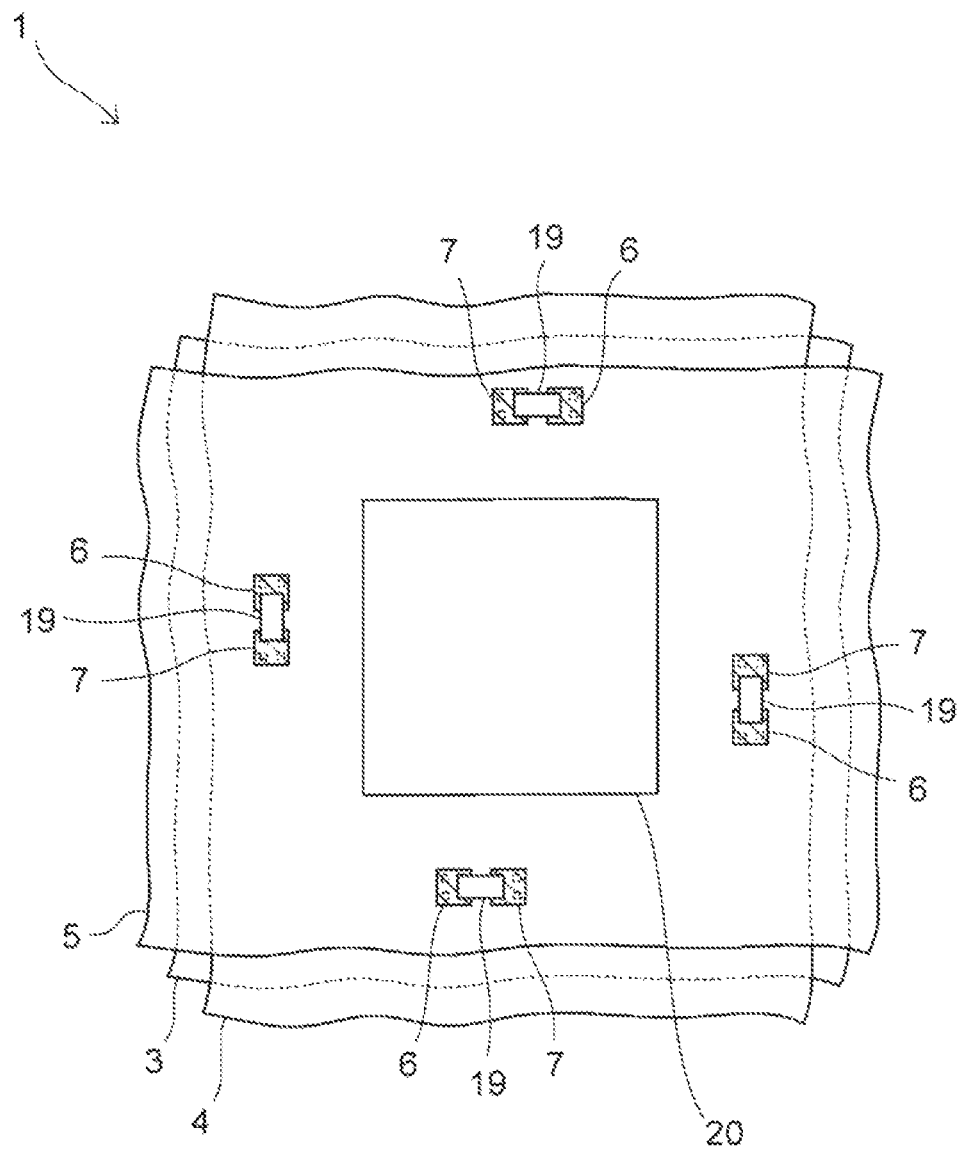
FIG. 4 is a plan view in which capacitors and a semiconductor element are mounted on the semiconductor device substrate according to the prelude.

FIG. 4 is a plan view in which capacitors 19 and a semiconductor element 20 are mounted on the semiconductor device substrate 1 in FIG. 1A.

Among these, the semiconductor element 20 is electrically connected to the power supply electrode 12 and the ground electrode 13 via solder bumps not illustrated.

Figure 5:
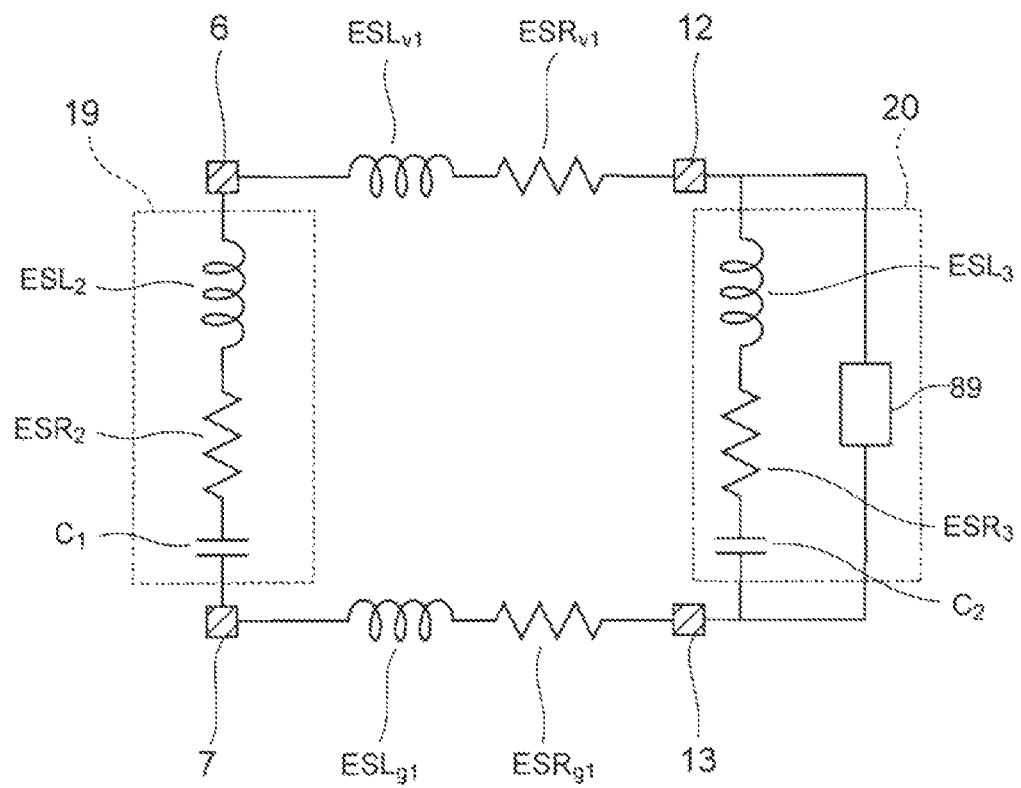
FIG. 5 is an equivalent circuit of the semiconductor device substrate according to the prelude in a state where the capacitor and the semiconductor element are mounted.

FIG. 5 is an equivalent circuit of the semiconductor device substrate 1 in a state where the capacitor 19 and the semiconductor element 20 are mounted as illustrated in FIG. 4.

As illustrated in FIG. 5, when the capacitor 19 is mounted, a second $ESL_2$ being a parasitic inductance of the capacitor 19, a second $ESR_2$ being a parasitic resistance thereof, and a capacitance component $C_1$ thereof are added between the power supply pad 6 and the ground pad 7.

Meanwhile, the semiconductor element 20 includes an internal circuit 89, and operates at a predetermined operating frequency by receiving a current supplied from the outside.

Due to the internal wiring and the like of the semiconductor element 20, a capacitance component C2, a third $ESL_3$, and a third $ESR_3$ inside the semiconductor element 20 are added between the power supply electrode 12 and the ground electrode 13.

Figure 6:
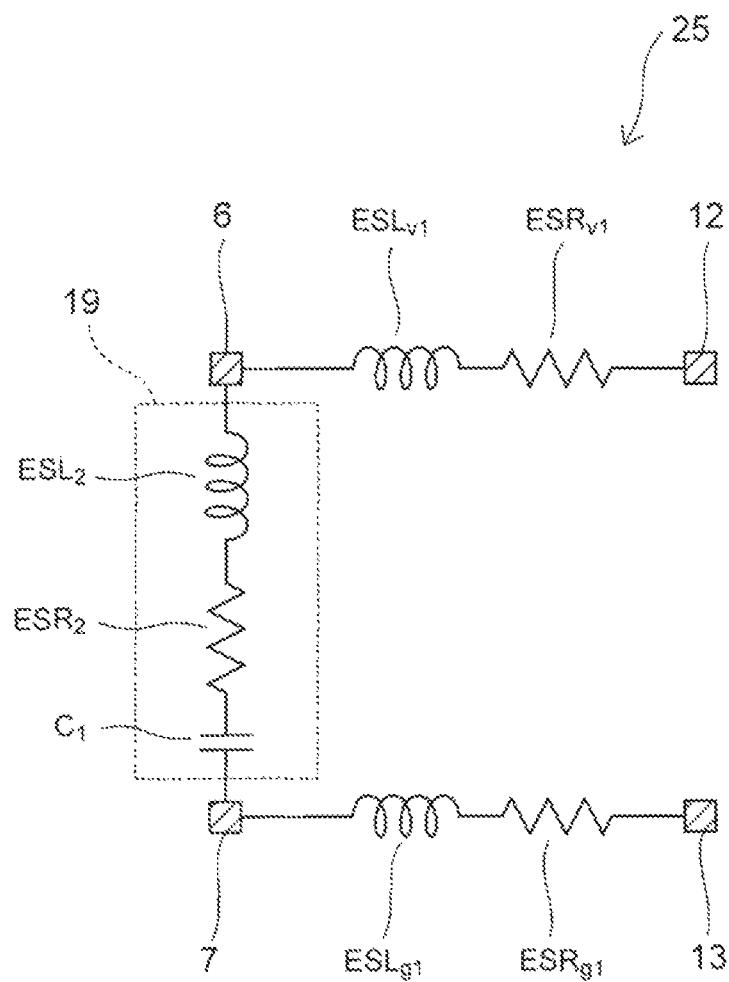
FIG. 6 is a circuit diagram of a first resonance circuit according to the prelude.
Figure 7:
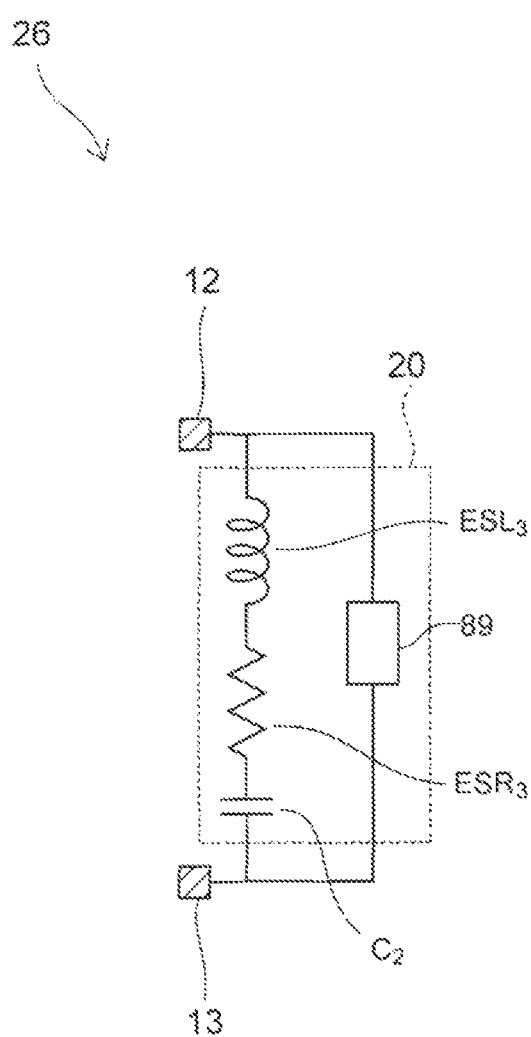
FIG. 7 is a circuit diagram of a second resonance circuit according to the prelude.

Being added with the $ESL_2$, $ESL_3$, $ESR_2$, $ESR_3$ and the capacitance components C1, C2, the semiconductor device substrate 1 is equal to a circuit in which a first resonance circuit 25 illustrated in FIG. 6 and a second resonance circuit 26 illustrated in FIG. 7 are connected in parallel.

The first resonance circuit 25 illustrated in FIG. 6 is the equivalent circuit of FIG. 5 which does not include the third $ESL_3$, the third $ESR_3$, and the capacitance component $C_2$ attributable to the semiconductor element 20, and is equal to the equivalent circuit of the semiconductor device substrate 1 on which the semiconductor element 20 is not mounted but only the capacitor 19 is mounted.

Meanwhile, the second resonance circuit 26 illustrated in FIG. 7 is the equivalent circuit of FIG. 5 which does not include the second $ESL_2$, the second $ESR_2$, and the capacitance component $C_1$ attributable to the capacitor 19, as well as the first power supply side $ESL_{v2}$, the first power supply side $ESR_{v2}$, the first ground side $ESL_{g1}$ and the first ground side $ESR_{g1}$.

Figure 8:
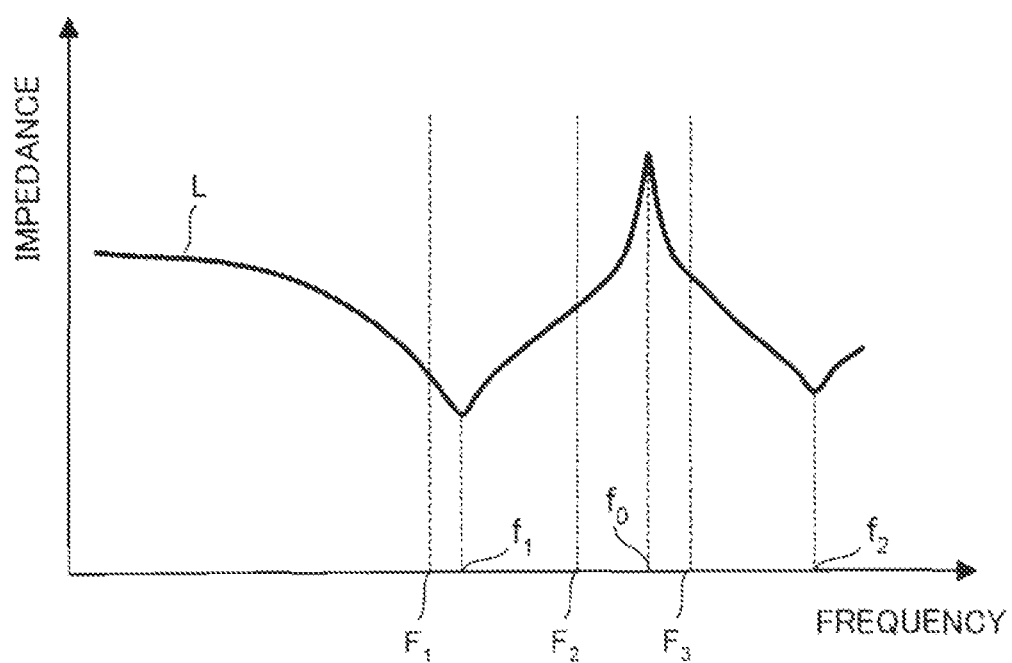
FIG. 8 is a graph illustrating an impedance curve of the equivalent circuit of FIG. 5.

FIG. 8 is a graph illustrating a power supply impedance curve of the equivalent circuit of FIG. 5. In FIG. 8, the horizontal axis represents the frequency and the vertical axis represents the power supply impedance between the power supply electrode 12 and the ground electrode 13.

This power supply impedance curve L is obtained by combining an impedance curve of the first resonance circuit 25 of FIG. 6 and an impedance curve of the second resonance circuit 26 of FIG. 7.

Accordingly, the impedance curve L has a minimum at each of a first resonance frequency $f_1$ being the resonance frequency of the first resonance circuit 25 and a second resonance frequency $f_2$ being the resonance frequency of the second resonance circuit 26.

It is known that if the two resonance circuits 25, 26 having the minimums of impedance at the resonance frequencies $f_1$, $f_2$, respectively, are combined, a parallel resonance frequency $f_0$ at which the impedance value is large occurs between the resonance frequencies $f_1$, $f_2$.

One or more operating frequencies, specifically operating frequencies $F_1$ to $F_3$ in this case, exist for one semiconductor element 20. When the operating frequencies $F_1$ to $F_3$ are closer to the parallel resonance frequency $f_0$, the impedance of the substrate at operating frequencies $F_1$ to $F_3$ increases. In such case, a large amount of noise appears in a waveform of a signal inside the semiconductor element 20, and this leads to malfunction of the circuit.

Accordingly, it is preferable that, in the case of designing the semiconductor device substrate 1, the $ESL_{v1}$, the $ESL_{g1}$, the $ESL_2$, the $ESR_{v1}$, the $ESR_{g1}$, $ESR_2$ from the semiconductor element to the capacitor part have such values that the parallel resonance frequency $f_0$ is as far away as possible from the operating frequencies $F_1$ to $F_3$ of the semiconductor element 20.

However, it has been found that the following problem occurs even if the semiconductor device substrate 1 is designed as described above.

Specifically, even if the semiconductor device substrate 1 is designed such that the parallel resonance frequency $f_0$ is far away from the operating frequencies $F_1$ to $F_3$ in one semiconductor element 20, the operating frequencies $F_1$ to $F_3$ may move close to each other when the internal circuit of the semiconductor element 20 is revised or when another semiconductor element 20 is mounted.

Figure 9:
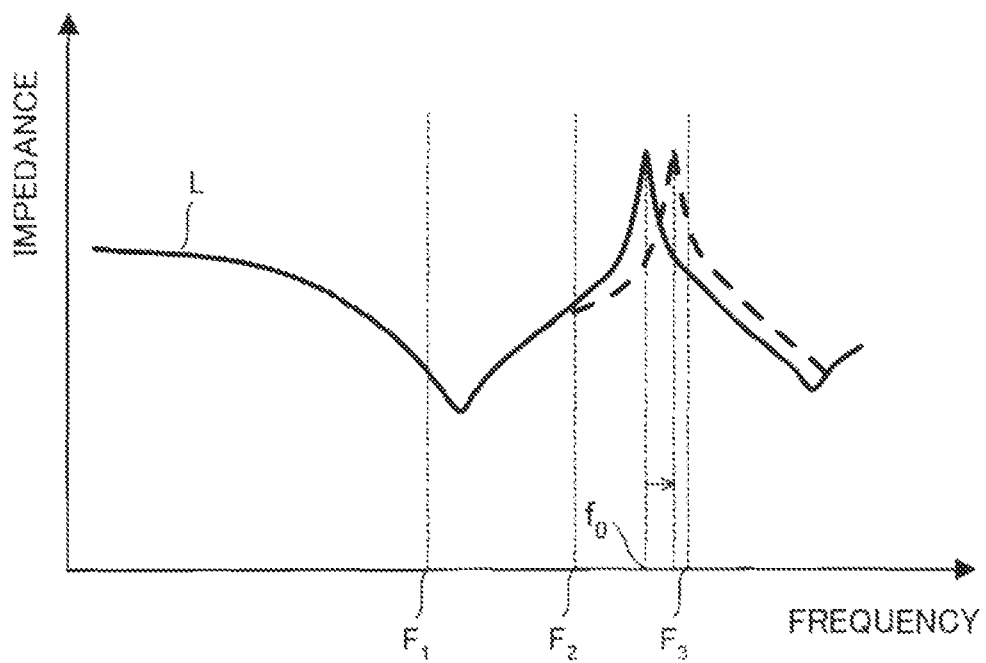
FIG. 9 is a graph illustrating an impedance curve in a case where a different semiconductor element is mounted on the semiconductor device substrate according to the prelude.

FIG. 9 is a graph illustrating an impedance curve in this case.

As illustrated in a bold line of FIG. 9, the parallel resonance frequency $f_0$ is far away from the operating frequencies $F_1$ to $F_3$ of the semiconductor element 20 in the original impedance curve L of the semiconductor element 20.

However, when the internal circuit of the semiconductor element 20 is revised and a semiconductor element 20 different from the original one is mounted on the semiconductor device substrate 1, there may be a case where the capacitance component $C_2$ of the semiconductor element 20 may have a different value from the original one and the parallel resonance frequency $f_0$ moves closer to the operating frequency $F_3$ of the semiconductor element 20 as illustrated in a dotted line of FIG. 9.

For example, if the capacitance component $C_2$ of the semiconductor element 20 is smaller than the original one, the parallel resonance frequency $f_0$ shifts to the right and moves closer to the operating frequency $F_3$.

In such case, problems such as occurrence of a large amount of noise in the signal inside the semiconductor element 20 occur. To solve such problems, it is conceivable to change the capacitance of the capacitor 19 and shift the position of the parallel resonance frequency $f_0$. However, since the capacitance of the commercially available capacitor 19 is fixed in advance, the value of the parallel resonance frequency $f_0$ may not be finely tuned (adjusted) by changing the capacitance of the capacitor 19.

In addition, there is another problem in which the value of the parallel resonance frequency $f_0$ is different from the expected value due to difference between the catalog value of the capacitance of the capacitor 19 and the manufacturing value thereof or due to thermal characteristics, and thus the parallel resonance frequency $f_0$ moves closer to the operating frequencies $F_1$ to $F_3$.

There is a method of using one semiconductor device substrate 1 for a plurality of types of semiconductor elements to reduce the design cost of a semiconductor device.

Figure 10:
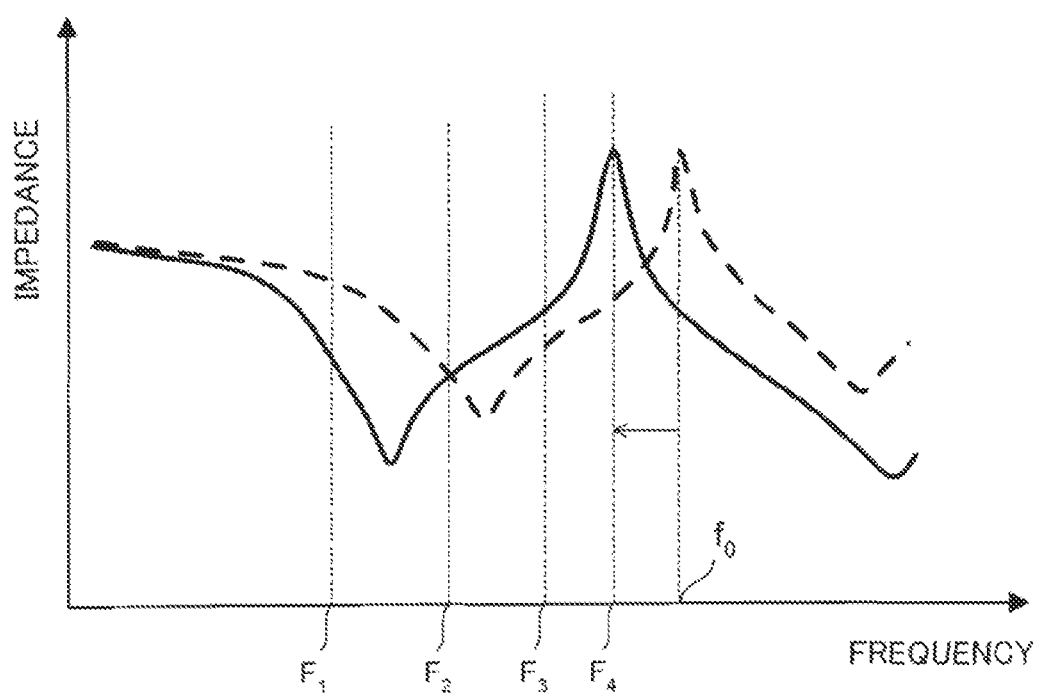
FIG. 10 is a graph illustrating problems which occur in a case where the semiconductor device substrate according to the prelude is used for a plurality of types of semiconductor elements.

FIG. 10 is a graph illustrating problems which occur in such case.

A dotted line illustrated in the graph of FIG. 10 is a power supply impedance curve of the semiconductor device when the semiconductor element 20 is mounted. Moreover, a bold line of FIG. 10 is a power supply impedance curve of the semiconductor device when a different semiconductor element 20 is mounted.

As described above, when the semiconductor element 20 mounted on the semiconductor device substrate 1 is changed, the impedance curve is shifted due to the difference in the value of the capacitance component $C_2$ between the semiconductor elements 20.

Accordingly, as illustrated in the bold line of FIG. 10, when the different semiconductor element 20 is mounted, the parallel resonance frequency $f_0$ moves closer to an operating frequency $F_4$ of the different semiconductor element 20, and unexpected noises occur in a signal in the semiconductor element 20.

In view of the findings described above, the inventors of the present application have conceived of the embodiments described below.

First Embodiment

Figure 11:
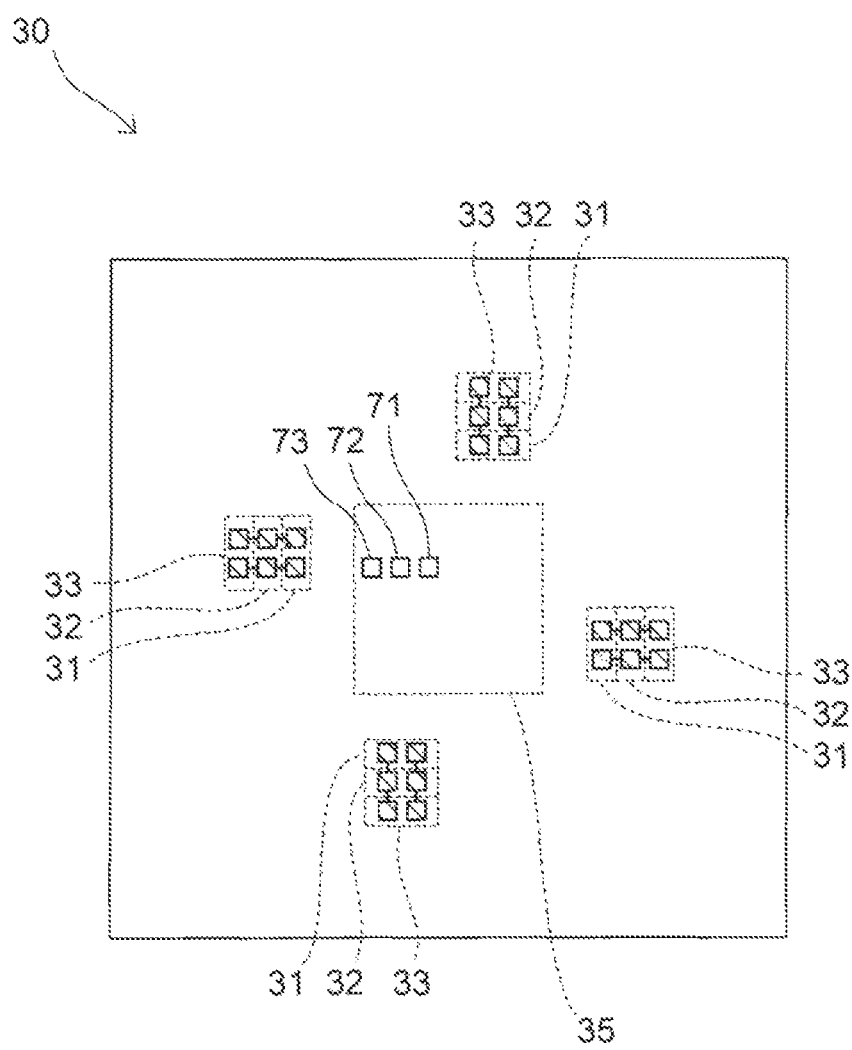
FIG. 11 is a plan view of a semiconductor device substrate according to a first embodiment.

FIG. 11 is a plan view of a semiconductor device substrate 30 according to a first embodiment.

The semiconductor device substrate 30 has a multi-layer wiring layer. In the uppermost layer of the multi-layer wiring layer, first to third capacitor pads 31 to 33 are formed by patterning conductive metal such as copper having a thickness of approximately 30 to 70 μm.

Positions of the capacitor pads 31 to 33 are not particularly limited. In the embodiment, the capacitor pads 31 to 33 are provided beside each of the four sides of a rectangular semiconductor element mounting region 35.

Moreover, inside the semiconductor element mounting region 35, a power supply electrode 71, a ground electrode 72, and a signal electrode 73 are provided by patterning a conductive metal such as copper, as similar to the capacitor pads 31 to 33.

Note that, a plurality of power supply electrodes 71, a plurality of ground electrodes 72, and a plurality of signal electrodes 73 are formed in the semiconductor element mounting region 35. However, to simplify the drawing, only one power supply electrode 71, one ground electrode 72, and one signal electrode 73 are illustrated in FIG. 11.

Figure 12:
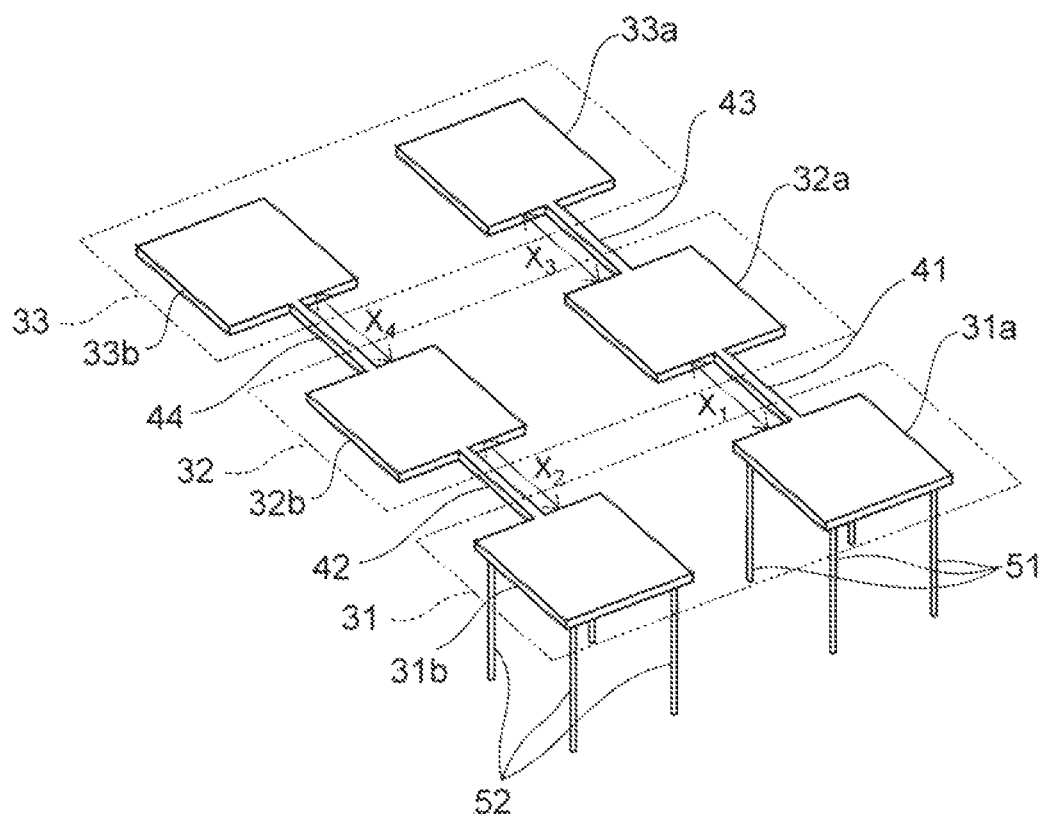
FIG. 12 is a perspective view of capacitor pads included in the semiconductor device substrate according to the first embodiment.

FIG. 12 is a perspective view of the capacitor pads 31 to 33.

As illustrated in FIG. 12, the first capacitor pad 31 includes a first power supply pad 31a and a first ground pad 31b, and first vias 51 and second vias 52 are provided under the first power supply pad 31a and the first ground pad 31b.

A material of the vias 51, 52 is not particularly limited. In the embodiment, copper is used as the material thereof.

In the embodiment, a plurality of vias 51 are provided under the first power supply pad 31a and a plurality of vias 52 are provided under the first ground pad 31b to reduce the electric resistances of the current paths passing through the vias 51, 52.

Moreover, the second capacitor pad 32 includes a second power supply pad 32a and a second ground pad 32b, and the third capacitor pad 33 includes a third power supply pad 33a and a third ground pad 33b.

Furthermore, the first power supply pad 31a and the second power supply pad 32a are connected to each other through a first wire 41, and the first ground pad 31b and the second ground pad 32b are connected to each other through a second wire 42.

Moreover, the second power supply pad 32a and the third power supply pad 33a are connected to each other through a third wire 43, and the second ground pad 32b and the third ground pad 33b are connected to each other through a fourth wire 44.

Wire lengths $X_1$ to $X_4$ of the respective wires 41 to 44 are not particularly limited. In the embodiment, all of the wire lengths $X_1$ to $X_4$ are equal to each other.

The capacitor pads 31 to 33 are used as pads on which a capacitor for decoupling is mounted.

Figure 13A:
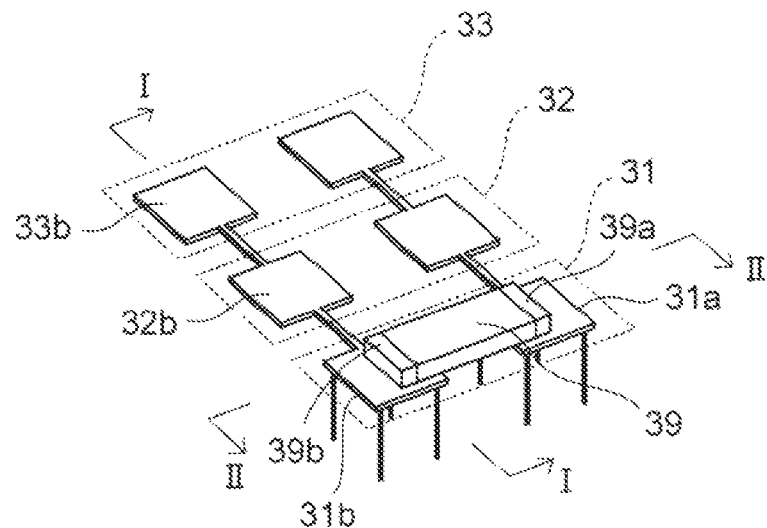
FIGS. 13A to 13C are each a perspective view of the capacitor pads according to the first embodiment in a state where a capacitor is mounted.
Figure 13B:
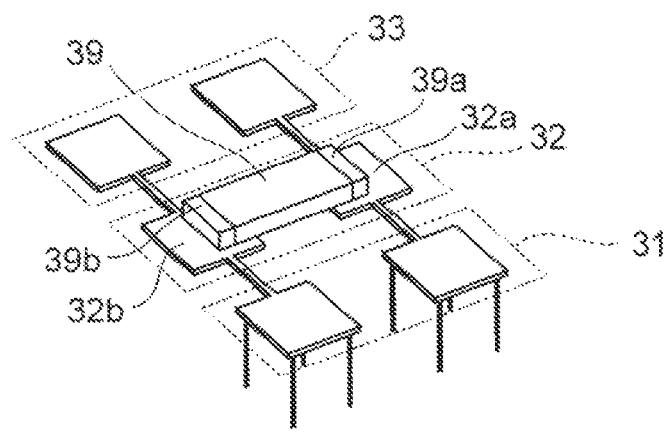
Figure 13C:
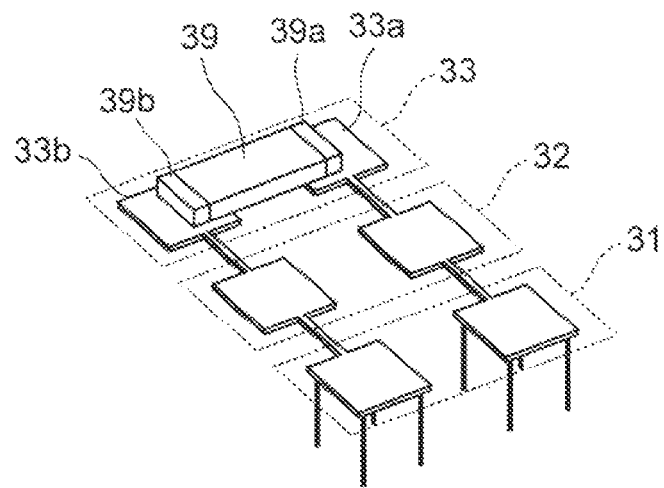

FIGS. 13A to 13C are each a perspective view of the capacitor pads 31 to 33 in a state where a capacitor 39 for decoupling is mounted.

Among them, FIG. 13A is the perspective view in the case where the capacitor 39 is mounted on the first capacitor pad 31, FIG. 13B is the perspective view in the case where the capacitor 39 is mounted on the second capacitor pad 32, and FIG. 13C is the perspective view in the case where the capacitor 39 is mounted on the third capacitor pad 33.

As illustrated in FIGS. 13A to 13C, the capacitor 39 is mounted on one of the capacitor pads 31 to 33.

When being mounted, the capacitor 39 has one electrode 39a thereof soldered to one of the first to third power supply pads 31a to 33a. Meanwhile, the other electrode 39b of the capacitor 39 is soldered to one of the first to third ground pads 31b to 33b which is in the same capacitor pad as the power supply pad soldered to the electrode 39a.

FIG. 14 is an enlarged cross-sectional view of a main portion of a semiconductor device of a ball grid array (BGA) type which is formed by mounting the capacitor 39 and a semiconductor element 40 on the semiconductor device substrate 30.

Note that, in FIG. 14, the cross-section of the ground pads 31b to 33b corresponds to the cross-section taken along the I-I line of FIG. 13A.

As illustrated in FIG. 14, the semiconductor device substrate 30 includes a multi-layer wiring layer 57. The multi-layer wiring layer 57 is formed by alternately stacking conductive layers such as a power supply layer 53, a ground layer 54, and a signal layer 55, and insulating layers 56. The material of each layer is not particularly limited. Here, copper pattern layers are formed as the conductive layers, and glass epoxy resin layers are formed as the insulating layers 56.

Then, the capacitor 39 is mounted on the first ground pad 31b formed in the uppermost layer of the multi-layer wiring layer 57 by using solder 70.

Meanwhile, on the multi-layer wiring layer 57 in the semiconductor element mounting region 35, the semiconductor element 40 is electrically and mechanically connected to the substrate 30 via solder bumps 65, and is also fixedly attached to the substrate 30 by underfill material 66.

The power supply electrode 71, the ground electrode 72, and the signal electrode 73 connected to the solder bumps 65 are provided in the multi-layer wiring layer 57 in the semiconductor element mounting region 35.

Third to fifth vias 61 to 63 including conductive material such as copper are formed in a portion of the multi-layer wiring layer 57 under the electrodes 71 to 73. The vias 61 to 63 are connected to the power supply layer 53, the ground layer 54, and the signal layer 55, respectively, as illustrated in the FIG. 14.

Meanwhile, the second vias 52 under the first ground pad 31b are connected to the ground layer 54.

A plurality of electrode pads 68 electrically connected to the layers 53 to 55 are provided on the back surface of the semiconductor device substrate 30. A solder ball serving as an external connection terminal 69 is connected to each of the electrode pads 68.

Figure 15:
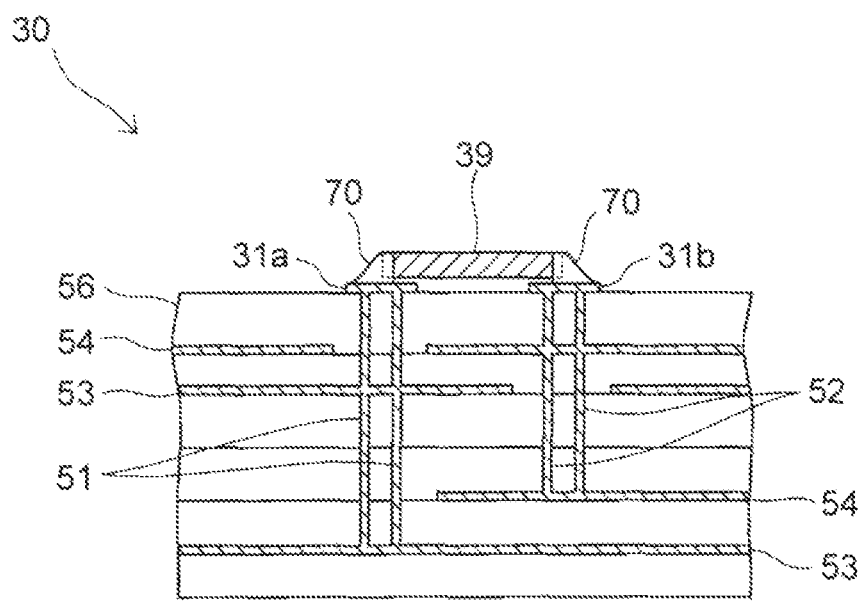
FIG. 15 is a cross-sectional view of the semiconductor device substrate according to the first embodiment, which is taken along the longitudinal direction of the capacitor.

FIG. 15 is a cross-sectional view of the semiconductor device substrate 30, which is taken in the longitudinal direction of the capacitor 39, and corresponds to the cross-section taken along a II-II line of FIG. 13A.

As illustrated in FIG. 15, the first vias 51 under the first power supply pad 31a is connected to the power supply layer 53.

Thus, both electrodes of the capacitor 39 are electrically connected to the power supply layer 53 and the ground layer 54, respectively, through the vias 51, 52. Hence, the capacitor 39 functions to absorb a fluctuation of a power supply voltage between the layers 53, 54.

As illustrated in FIGS. 13A to 13C, in such semiconductor device substrate 30, the plurality of capacitor pads 31 to 33 are provided, and one of the pads is selected to mount the capacitor 39 thereon.

Figure 16:
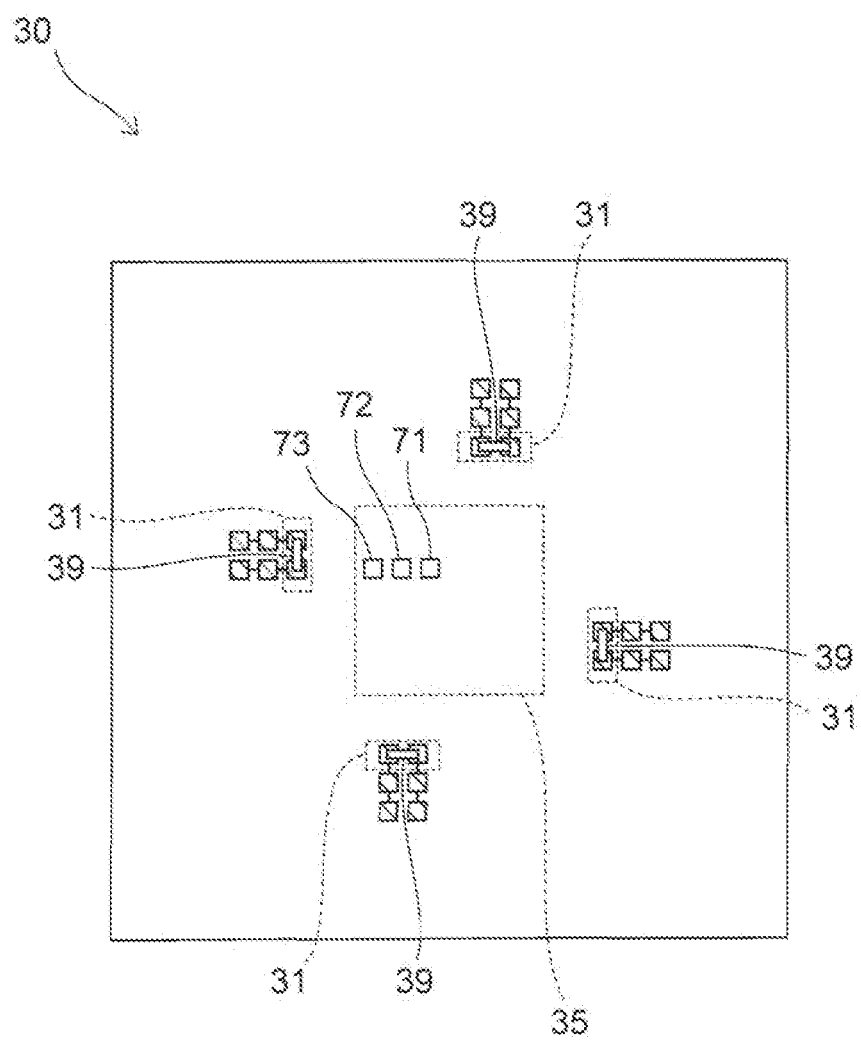
FIG. 16 is a plan view of the semiconductor device substrate according to the first embodiment in a state where the capacitors are mounted on first capacitor pads.
Figure 17:
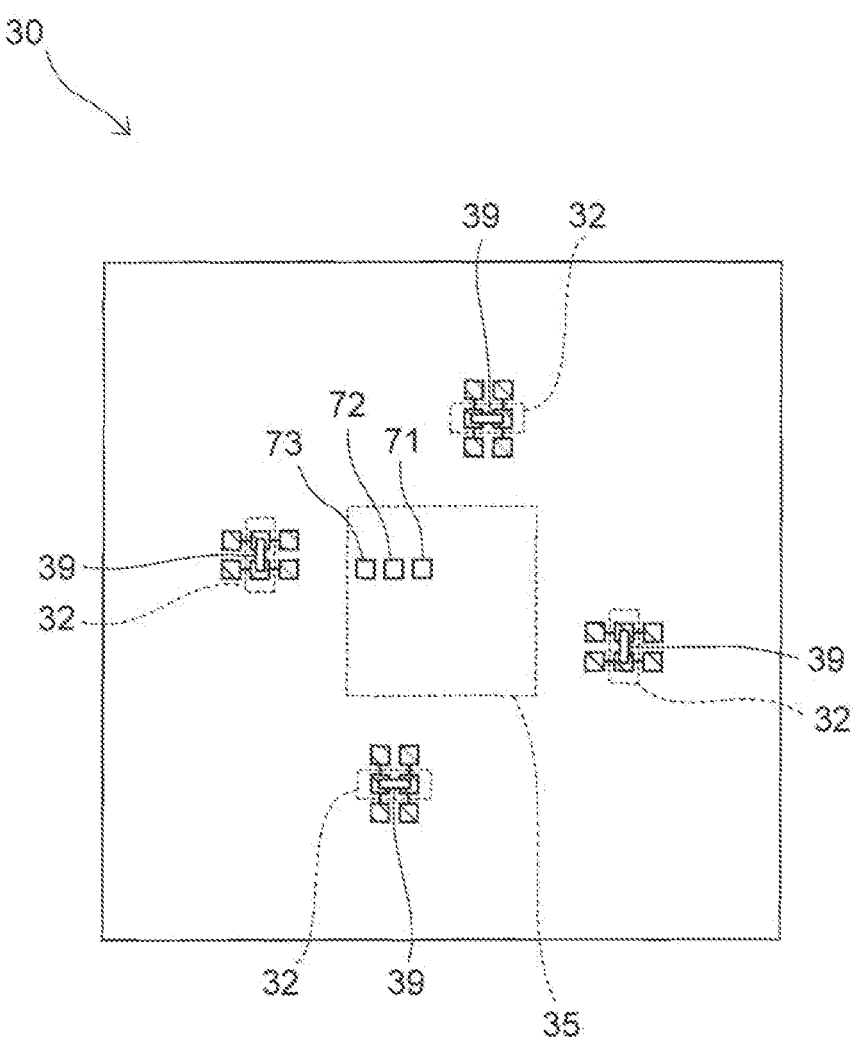
FIG. 17 is a plan view of the semiconductor device substrate according to the first embodiment in a state where the capacitors are mounted on second capacitor pads.
Figure 18:
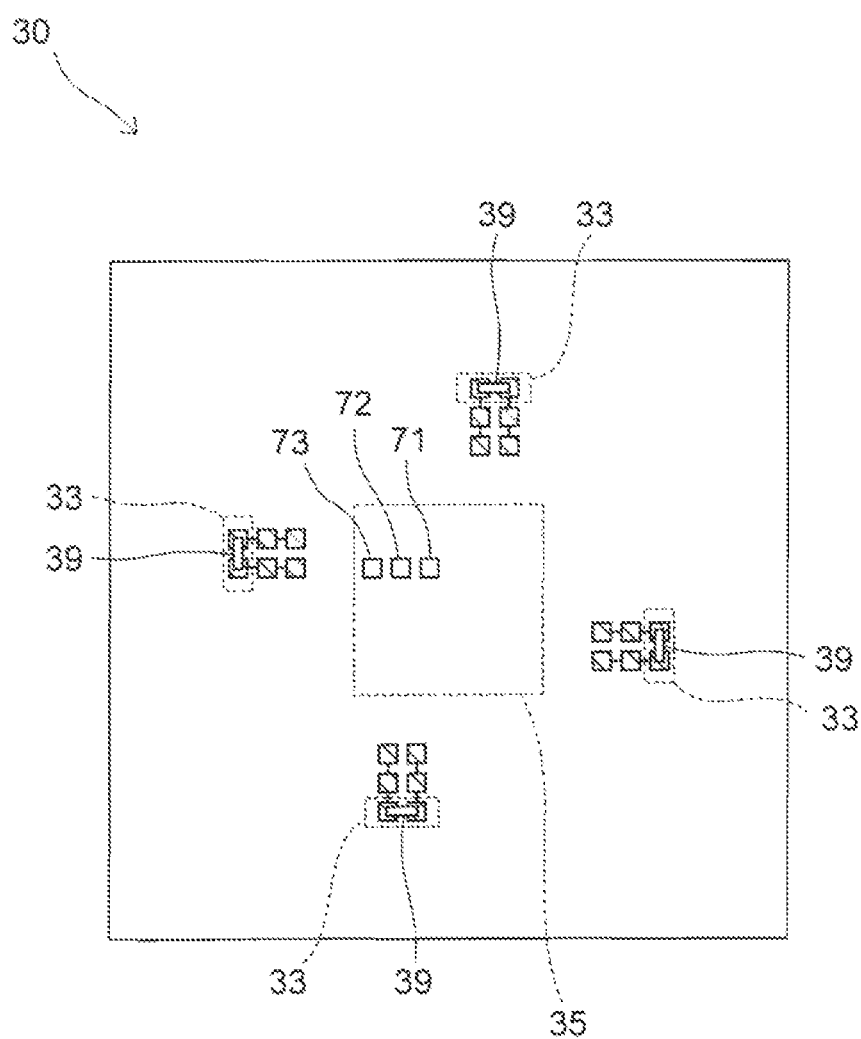
FIG. 18 is a plan view of the semiconductor device substrate according to the first embodiment in a state where the capacitors are mounted on third capacitor pads.

FIGS. 16 to 18 are each a plan view of the semiconductor device substrate 30 in a state where the capacitors 39 are mounted on one type of the capacitor pads 31 to 33.

Among them, FIG. 16 is a plan view in which the capacitors 39 are mounted on the first capacitor pads 31, FIG. 17 is a plan view in which the capacitors 39 are mounted on the second capacitor pads 32, and FIG. 18 is a plan view in which the capacitors 39 are mounted on the third capacitor pads 33.

In all of the cases illustrated in FIGS. 16 to 18, a plurality of capacitor pads 31, a plurality of capacitor pads 32, and a plurality of capacitor pads 33 are provided around the semiconductor element mounting region 35. Moreover, since the capacitors 39 are arranged beside the four sides of the rectangular semiconductor element mounting region 35, the effects of preventing the fluctuation of the power supply voltage by the respective capacitors 39 may be made equal to one another at positions near the sides.

Furthermore, in the embodiment, the parallel resonance frequency of the semiconductor device substrate 30 may be adjusted as described below by changing the capacitor pads 31 to 33 on which the capacitors 39 are to be mounted as illustrated in FIGS. 16 to 18.

Figure 19:
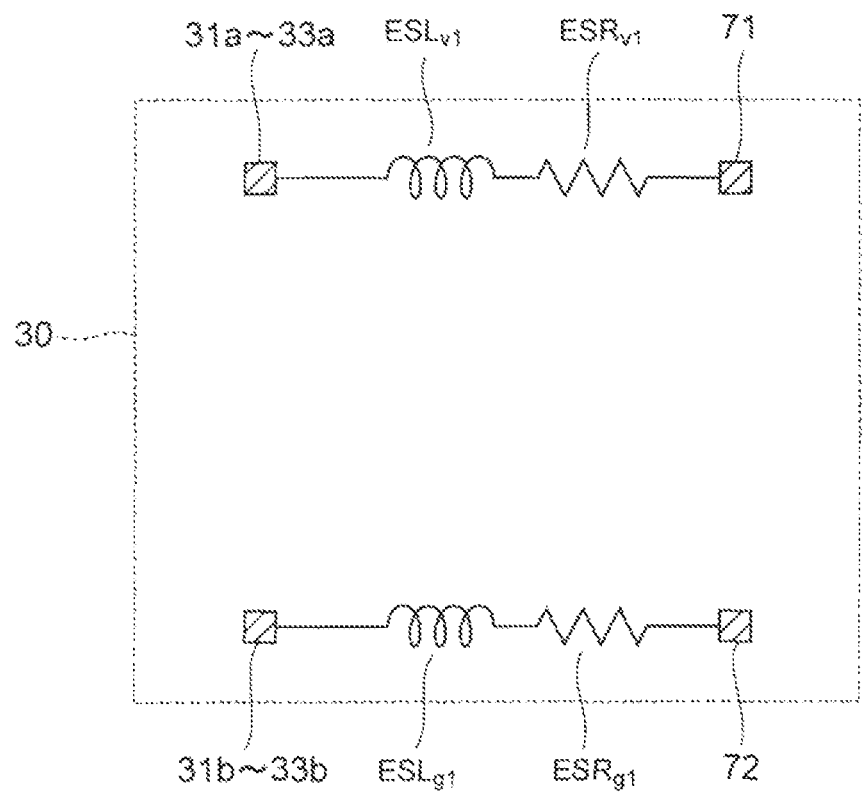
FIG. 19 is an equivalent circuit of the semiconductor device substrate according to the first embodiment in a state where the capacitor and the semiconductor element are not mounted.

FIG. 19 is an equivalent circuit of the semiconductor device substrate in a state where the capacitor 39 and the semiconductor element 40 are not mounted.

As described in the prelude, the semiconductor device substrate 30 includes various ESLs and ESRs corresponding to wiring paths therein.

In the example of FIG. 19, a first power supply side $ESL_{v1}$ and a first power supply side $ESR_{v1}$ exist between the power supply electrode 71 and the corresponding one of the first to third power supply pads 31a to 33a. Similarly, a first ground side $ESL_{v1}$ and a first ground side $ESR_{g1}$ exist between the ground electrode 72 and the corresponding one of the first to third ground pads 31b to 33b.

In the embodiment, the values of $ESL_{v1}$, $ESR_{v1}$, $ESL_{g1}$, and $ESR_{g1}$ change depending on the selected one of the capacitor pads 31 to 33, due to resistance components and inductances of the wires 41 to 44 (see FIG. 12) connecting the capacitor pads 31 to 33 to each other.

For example, if the first capacitor pad 31 is selected to which a voltage is supplied from the first vias 51 and the second vias 52 without passing through the wires 41 to 44 (see FIG. 12), there is no need to consider the resistance components and the inductances of the wires 41 to 44. Thus, the value of each of $ESL_{v1}$, $ESR_{v1}$, $ESL_{g1}$, and $ESR_{g1}$ is the smallest.

When the second capacitor pad 32 is selected, the first wire 41 and the second wire 42 exist between the second capacitor pad 32 and the first capacitor pad 31. Thus, the value of each of $ESL_{v1}$, $ESR_{v1}$, $ESL_{g1}$, and $ESR_{g1}$ is larger than the case of selecting the first capacitor pad 31 by an amount corresponding to resistance components and inductances of the wires 41, 42, as well as the ESLs and ESRs of the power supply pad 32a and the ground pad 32b.

When the third capacitor pad 33 farthest from the first capacitor pad 31 is selected, the value of each of $ESL_{v1}$, $ESR_{v1}$, $ESL_{g1}$, and $ESR_{g1}$ is larger by an amount corresponding to resistance components and inductances of a third wires 43 and a fourth wires 44, as well as the ESLs and ESRs of the power supply pad 32a and the ground pad 32b.

Figure 20:
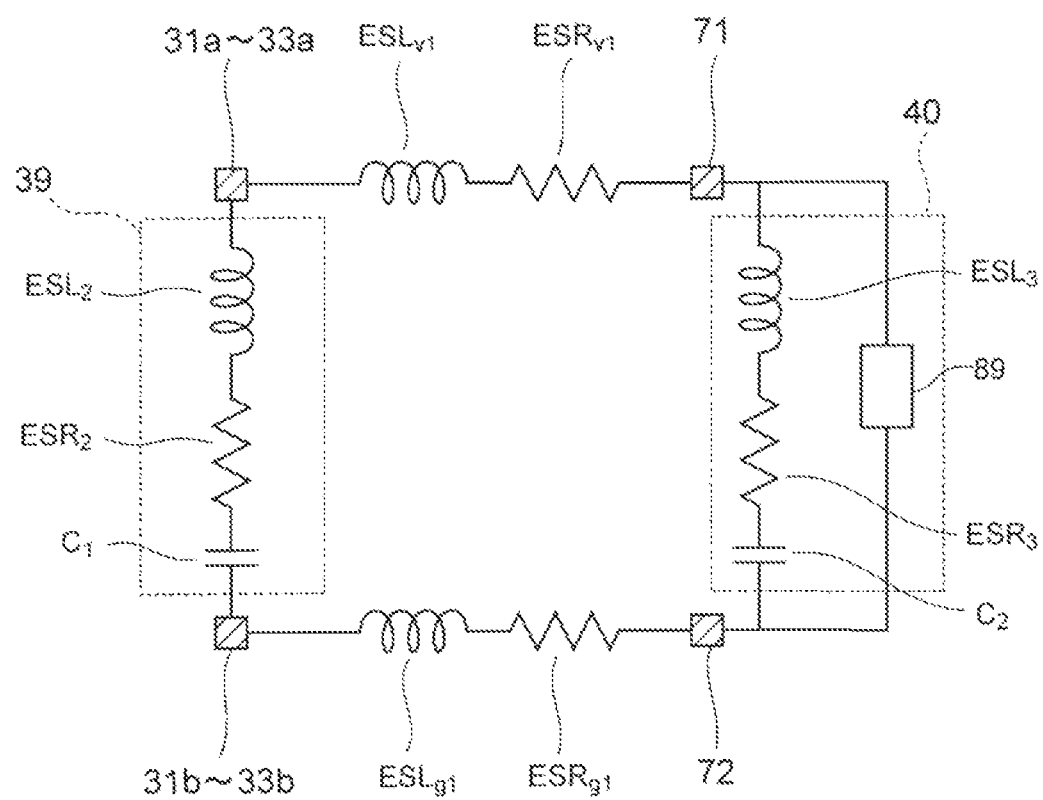
FIG. 20 is an equivalent circuit of the semiconductor device substrate according to the first embodiment in a state where the capacitor and the semiconductor element are mounted.

FIG. 20 is an equivalent circuit of the semiconductor device substrate 30 in a state where the capacitor 39 and the semiconductor element 40 are mounted.

As illustrated in FIG. 20, when the capacitor 39 is mounted, a second $ESL_2$ being a parasitic inductance of the capacitor 39, a second $ESR_2$ being a parasitic resistance thereof, and a to capacitance component $C_1$ thereof are added between the power supply pads 31a to 33a and the ground pads 31b to 33b.

Meanwhile, the semiconductor element 20 includes an internal circuit 89, and operates at a predetermined operating frequency by receiving a current supplied from the outside. Due to the internal wiring and the like of the semiconductor element 40, a capacitance component C2, a third $ESL_3$, and a third $ESR_3$ inside the semiconductor element 40 are added between the power supply electrode 71 and the ground electrode 72.

Figure 21:
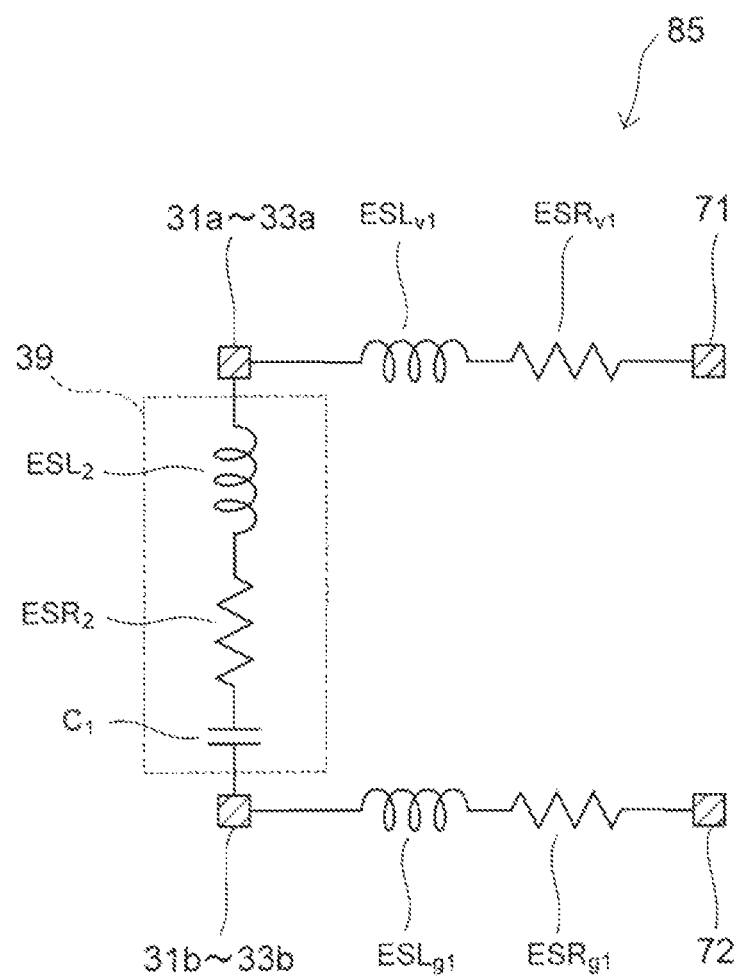
FIG. 21 is a circuit diagram of a first resonance circuit according to the first embodiment.
Figure 22:
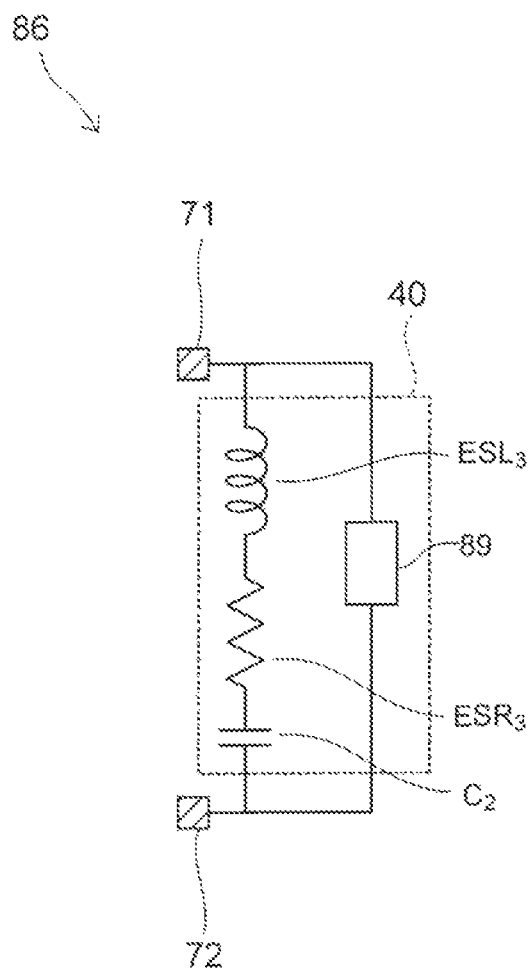
FIG. 22 is a circuit diagram of a second resonance circuit according to the first embodiment.

Being added with the $ESL_2$, $ESL_3$, $ESR_2$, $ESR_3$ and the capacitance components C1, C2, the semiconductor device substrate 30 is equal to a circuit in which a first resonance circuit 85 illustrated in FIG. 21 and a second resonance circuit 86 illustrated in FIG. 22 are connected in parallel.

The first resonance circuit 85 illustrated in FIG. 21 is the equivalent circuit of FIG. 20 which does not include the third $ESL_3$, the third $ESR_3$, and the capacitance component $C_2$ attributable to the semiconductor element 40, and is equal to the equivalent circuit of the semiconductor device substrate 30 on which the semiconductor element 40 is not mounted but only the capacitor 39 is mounted.

Meanwhile, the second resonance circuit 86 illustrated in FIG. 22 is the equivalent circuit of FIG. 20 which does not include the second $ESL_2$, the second $ESR_2$, and the capacitance component $C_1$ attributable to the capacitor 19, as well as the first power supply side $ESL_{v1}$, the first power supply side $ESR_{v1}$, the first ground side $ESL_{g1}$ and the first ground side $ESR_{g1}$. The second resonance circuit 86 is equal to the equivalent circuit having only the semiconductor element 40.

Figure 23:
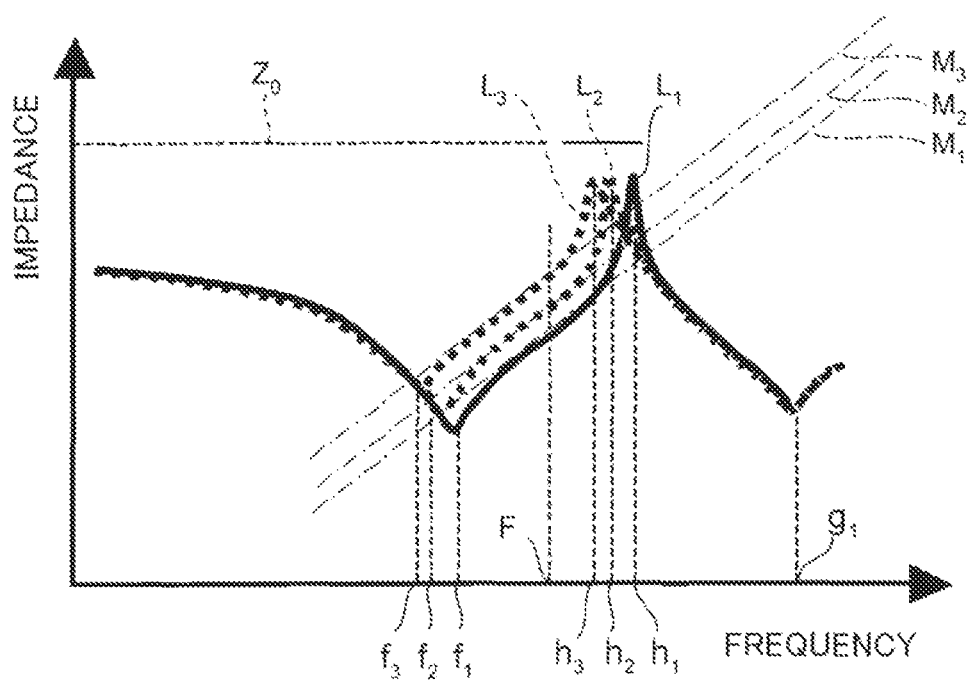
FIG. 23 is a graph illustrating an impedance curve of the equivalent circuit of FIG. 20.

FIG. 23 is a graph illustrating an impedance curve $L_1$ to $L_3$ of the equivalent circuit of FIG. 20. In FIG. 23, the horizontal axis represents the frequency and the vertical axis represents the power supply impedance between the electrodes 71, 72.

These impedance curves $L_1$ to $L_3$ have forms obtained by combining an impedance curve of the first resonance circuit 25 of FIG. 21 and an impedance curve of the second resonance circuit 26 of FIG. 22. One of three curve forms appears depending on which one of the three capacitor pads 31 to 33 the capacitor 39 is mounted on.

For example, the impedance curve $L_1$ in the graph corresponds to a state where the capacitor 39 is mounted on the first capacitor pad 31. The impedance curve $L_2$ in the graph corresponds to a state where the capacitor 39 is mounted on the second capacitor pad 32.

Moreover, the impedance curve $L_3$ in the graph corresponds to a state where the capacitor 39 is mounted on the third capacitor pad 33.

Each of the curves $L_1$ to $L_3$ has a minimum at each of a corresponding one of first resonance frequencies $f_1$ to $f_3$ being the resonance frequency of a first resonance circuit 85 and a second resonance frequency $g_1$ being the resonance frequency of a second resonance circuit 86.

Furthermore, as described in the prelude, parallel resonance frequencies $h_1$ to $h_3$ at which the impedance values are large each occur between the second resonance frequency $g_1$ and the corresponding one of the first resonance frequencies $f_1$ to $f_3$.

The value of the parallel resonance frequency changes among the values of the parallel resonance frequencies $h_1$ to $h_3$ depending on which one of the first capacitor pads 31 to 33 the capacitor 39 is mounted on.

This is because the position of a tangential line changes among the positions of tangential lines $M_1$ to $M_3$ at the inflection points of the curves $L_1$ to $L_3$ between the first resonance frequencies $f_1$ to $f_3$ and the parallel resonance frequencies $h_1$ to $h_3$ depending on the values of the $ESL_{v1}$, the $ESR_{v1}$, the $ESL_{g1}$, and the $ESR_{g1}$, and these values of the $ESL_{v1}$, the $ESR_{v1}$, the $ESL_{g1}$, and the $ESR_{g1}$ vary depending on which one of the capacitor pads 31 to 33 is selected.

As described above, in the embodiment, by selecting one of the capacitor pads 31 to 33 and mounting the capacitor 39 thereon, one of the three parallel resonance frequencies $h_1$ to $h_3$ may be selected.

By selecting one of the three parallel resonance frequencies $h_1$ to $h_3$ which is farthest from the operating frequency F of the semiconductor element 40, increase of noise due to the operating frequency F being close to the parallel resonance frequency may be prevented.

Thus, even in a case where a new semiconductor element 40 being different from the one of original design is mounted on the semiconductor device substrate 30, one of the capacitor pads 31 to 33 on which the capacitor 39 is to be mounted is reselected. This may prevent the operating frequency of the new semiconductor element 40 from moving closer to the parallel resonance frequencies $h_1$ to $h_3$.

This configuration may allow one semiconductor device substrate 30 to be commonly used for a plurality of types of semiconductor elements 40, and reduce the cost of the semiconductor device.

Furthermore, even in a case where any one of the parallel resonance frequencies $h_1$ to $h_3$ moves close to the operating frequency F due to manufacturing variation in capacitance of the capacitor 39, the capacitor 39 is re-mounted on a different one of the capacitor pads 31 to 33. Thus, the problem of the parallel resonance frequencies $h_1$ to $h_3$ being close to the operating frequency F may be overcome.

When the semiconductor device is designed, in some cases, a target impedance $Z_0$ of the power supply is determined for every frequency to suppress the power supply fluctuation of the semiconductor device. Since the heights of the peaks of the curves $L_1$ to $L_3$ at the parallel resonance frequencies $h_1$ to $h_3$ are close to the target impedance $Z_0$, the heights of the peaks are preferably made as small as possible.

According to this embodiment, the curve $L_1$ has the smallest height of the peak among the peaks of the curves $L_1$ to $L_3$ at the parallel resonance frequencies $h_1$ to $h_3$, the peak of the curve $L_2$ has the second smallest height, and the peak of the curve $L_3$ has the largest height. This fact becomes apparent by the simulation performed by the inventors of this application.

The following fact is conceivable as the reason for this. The larger the values of the $ESL_{v1}$ and the $ESL_{g1}$ are, the larger the heights of the peaks of the curves $L_1$ to $L_3$ at the parallel resonance frequencies $h_1$ to $h_3$ are. The values of the $ESL_{v1}$ and the $ESL_{g1}$ are the smallest in the first capacitor pad 31, are the second smallest in the second capacitor pad 32, and are the largest in the third capacitor pad 33. Thus, it is conceivable that difference in the height of the peak occurs as described above.

Next, the simulation result of the embodiment will be described.

Figure 24:
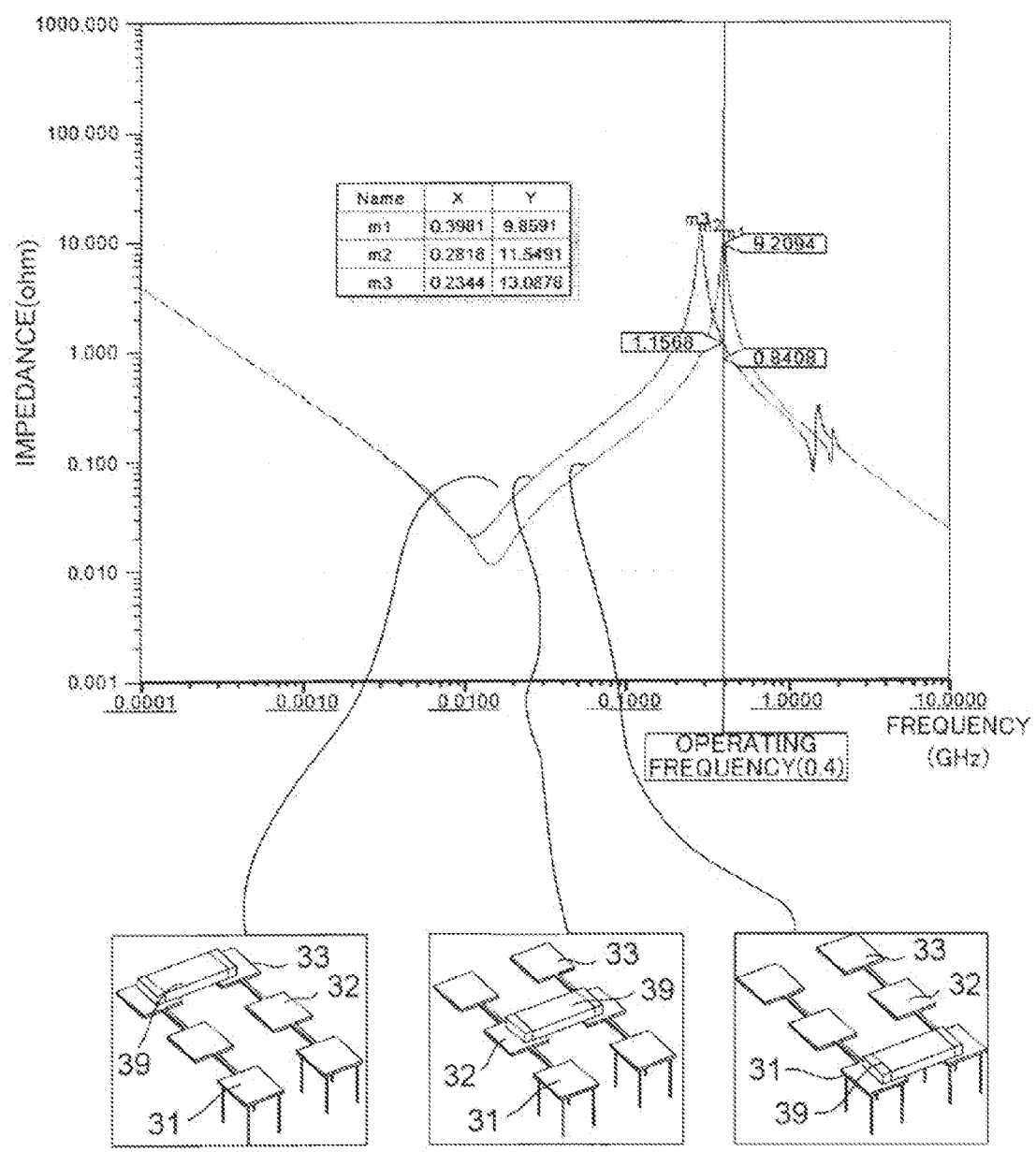
FIG. 24 illustrates impedance curves of the semiconductor device substrate according to the first embodiment which are obtained from the simulation.

FIG. 24 illustrates impedance curves of the semiconductor device substrate 30 which are obtained from the simulation.

In this simulation, the plane shape of the semiconductor device substrate 30 is a square with the length of each side being 40 mm. As illustrated in FIG. 14, two layers of the power supply layers 53 and two layers of the ground layers 54 are provided. Moreover, the capacitors 39 are mounted beside all of the four sides of the rectangular semiconductor element 40.

In FIG. 24, m1 to m3 are each a coordinate point of the parallel resonance frequency (X) and the peak height thereof (Y) when the capacitors 39 are mounted on a corresponding one type of the capacitor pads 31 to 33.

For example, when the capacitors 39 are mounted on the first capacitor pads 31, the parallel resonance frequency of 0.3981 GHz occurs at the coordinate point m1 and the peak height thereof is 9.8591 ohm.

As is apparent from this simulation result, the point where the parallel resonance frequency occurs may be changed from one of the coordinate points m1 to m3 to another by selecting a different type of the first to third capacitor pads 31 to 33 as capacitor pads on which the capacitors 39 are to be mounted.

For example, in a case where the operating frequency of the semiconductor element 40 is 0.4 GHz which is close to the coordinate point m1, the capacitors 39 is mounted on the second capacitor pads 32 or the third capacitor pads 33. Thus, the parallel resonance frequency may occur at the coordinate point m2 or m3 which is far from the operating frequency of the semiconductor element 40.

Furthermore the following advantage may be to obtained. When the first capacitor pads 31 are selected, the impedance of the substrate 30 at the operating frequency (0.4 GHz) of the semiconductor element 40 is 9.2094 ohm. Meanwhile, when the second capacitor pads 32 are selected, the impedance may be reduced to approximately 1.1568 ohm, and the impedance value may be reduced by approximately 88% in comparison with the case of selecting the first capacitor pads 31.

Moreover, when the third capacitor pads 33 are selected, the impedance at the operating frequency (0.4 GHz) is 0.8408 ohm, and the impedance value may be reduced by approximately 91% in comparison with the case of selecting the first capacitor pads 31.

It becomes apparent that reducing the impedance at the operating frequency of the semiconductor element 40 as described above makes noise less likely to appear in the power supply voltage and the signal waveform of the operating semiconductor element 40 in the embodiment, and this may enable prevention of circuit malfunction and stable operation.

The modified examples of the embodiment will be described below.

First Modified Example

In the above description, the capacitors 39 are mounted beside all of the sides of the rectangular semiconductor element mounting region 35 as illustrated in FIGS. 16 to 18.

Figure 25:
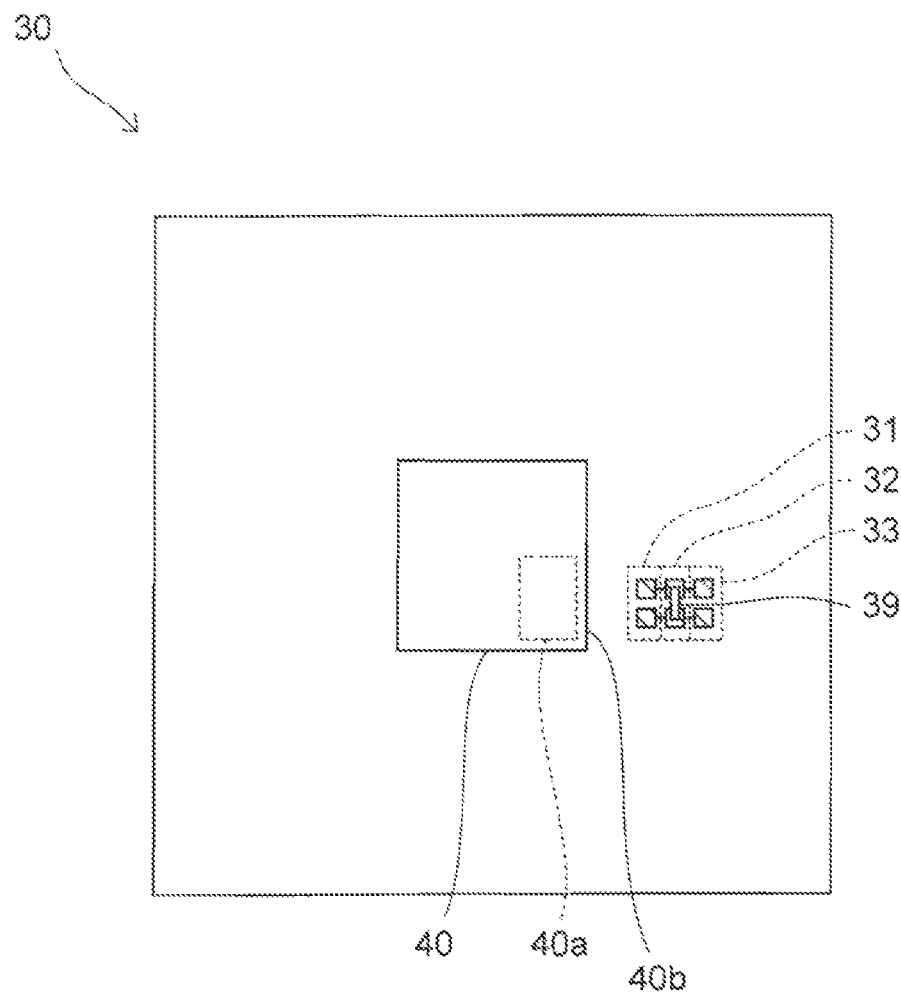
FIG. 25 is a plan view of the semiconductor device substrate according to a first modified example of the first embodiment.

Meanwhile, as illustrated in FIG. 25, the first to third capacitor pads 31 to 33 are provided beside only one side 40b of the semiconductor element 40 in this example. The capacitor 39 is mounted on one of the first to third capacitor pads 31 to 33.

When a functional block 40a of the semiconductor element 40 is arranged close to the side 40b among the four sides, the capacitor 39 is mounted beside the side 40b to effectively reduce the fluctuation of the power supply voltage in the functional block 40a.

Examples of the functional block 40a include a video signal processing block, an audio signal processing block, a control signal processing block, a DDR interface block, and the like.

Second Modified Example

Figure 26:
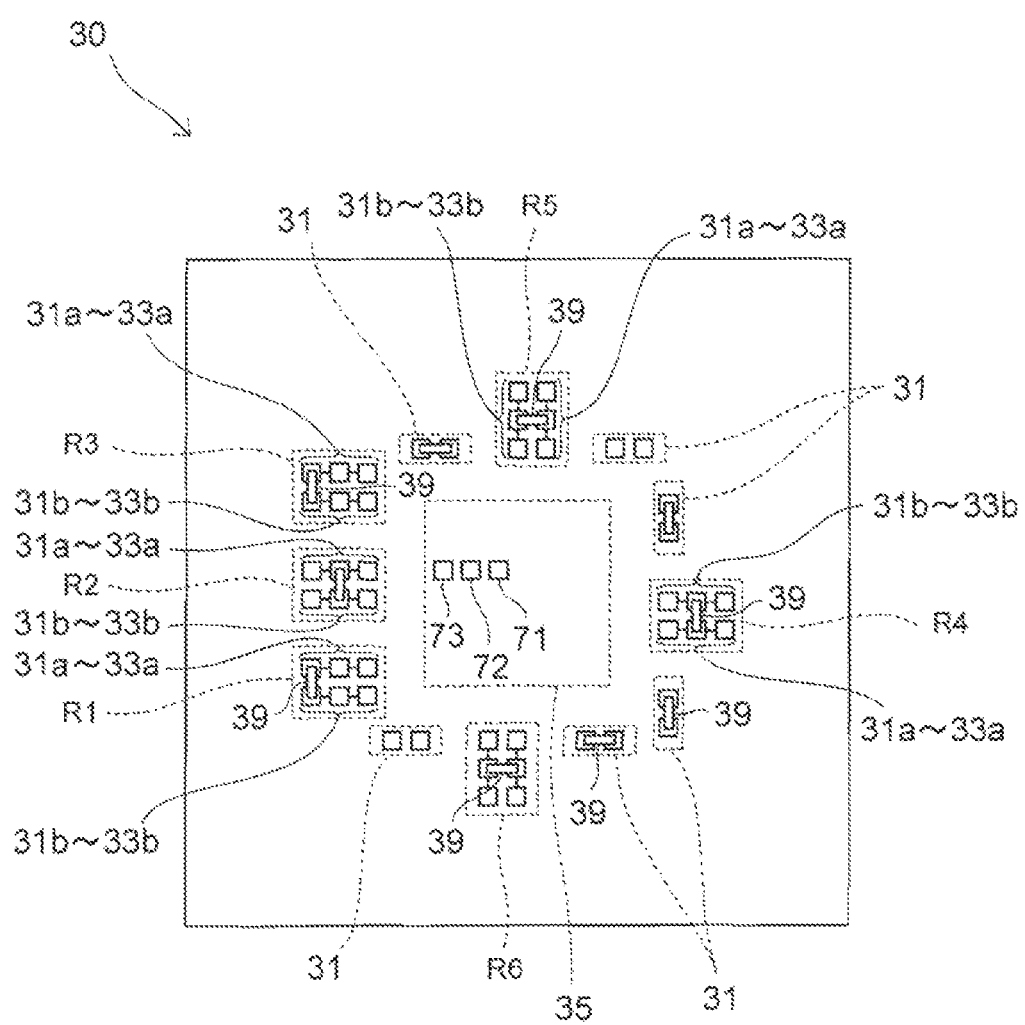
FIG. 26 is a plan view of the semiconductor device substrate according to a second modified example of the first embodiment.

In the example, the first to third capacitor pads 31 to 33 are provided in a plan layout as illustrated in FIG. 26.

As illustrated in FIG. 26, first to sixth regions R1 to R6 are provided in the semiconductor device substrate 30 as desired in the example, and the first to third capacitor pads 31 to 33 are arranged in each of the regions R1 to R6.

In this configuration, the first to third ground pads 31b to 33b of the regions R1 to R6 are electrically connected to each other via the ground layer.

Meanwhile, it may be possible to provide a plurality of power supply layers with different potentials in the substrate 30 and electrically connect the first to third power supply pads 31a to 33a to a different power supply layer for each of the regions R1 to R6. Examples of the power supply layers with different potentials include a core power supply layer connected to a resister or the like of the semiconductor element 40, an Input Output (IO) power supply layer connected to an external bus interface circuit of the semiconductor element 40, a high-speed macro power supply layer, and the like.

This configuration may allow, for example, the capacitor 39 in the first region R1 to function as a decoupling capacitor of the core supply layer and the capacitor 39 in the second region R2 to function as a decoupling capacitor of the IO power supply layer.

Furthermore, as illustrated in FIG. 26, the first capacitor pads 31 which are not connected to the second capacitor pads 32 and the third capacitor pads 33 may be provided in a region outside the regions R1 to R6.

Second Embodiment

In the embodiment, the arrangement of the first to third capacitor pads 31 to 33 is different from that of the first embodiment. Otherwise, the embodiment is the same as the first embodiment.

Figure 27:
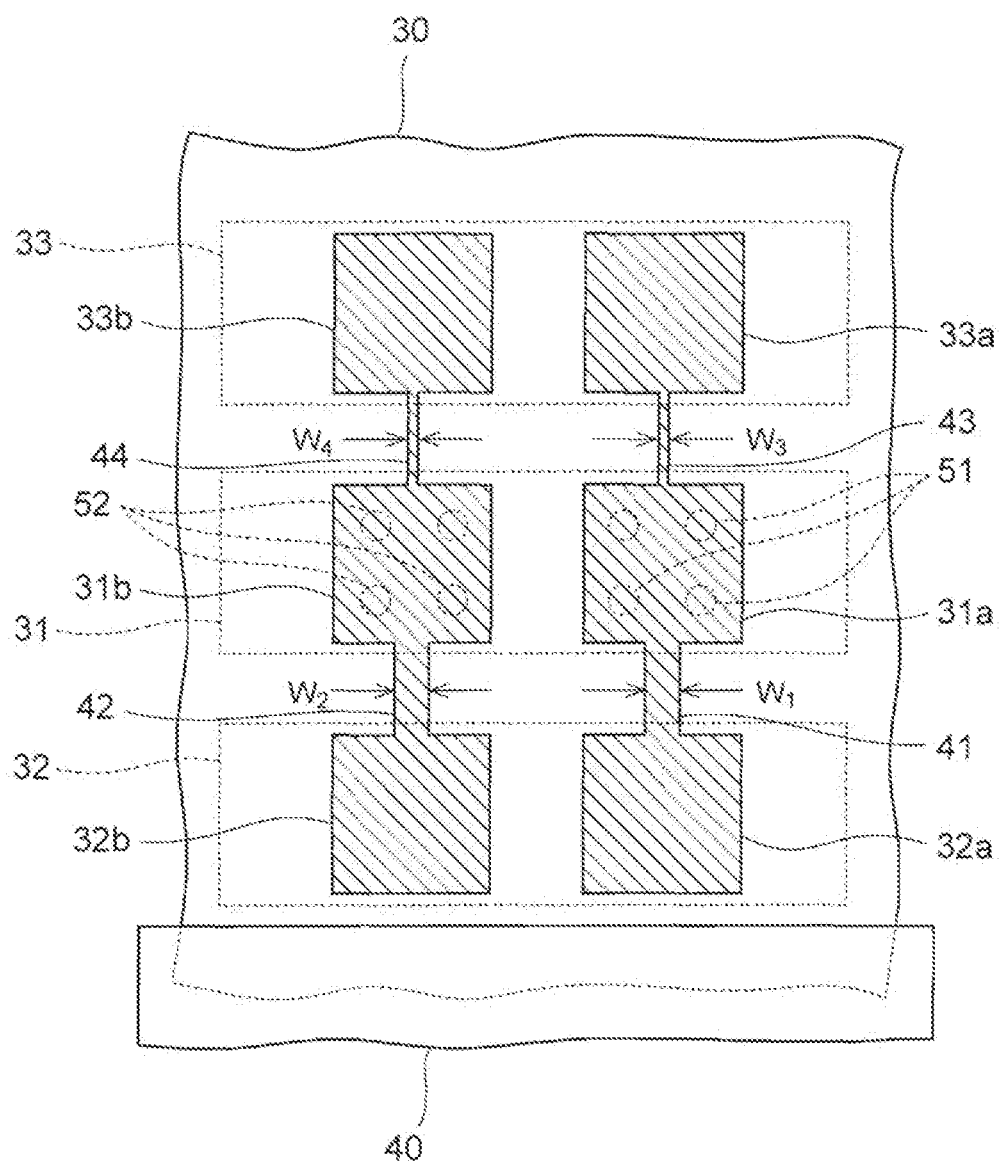
FIG. 27 is an enlarged plan view of first to third capacitor pads included in a semiconductor device substrate according to a second embodiment.

FIG. 27 is an enlarged plan view of first to third capacitor pads 31 to 33 included in a semiconductor device substrate 30 according to the embodiment. Note that, elements which are the same as those described in the first embodiment are denoted by the same reference numerals in FIG. 27, and descriptions thereof are omitted below.

As illustrated in FIG. 27, a second capacitor pad 32 and a third capacitor pad 33 are provided respectively on two opposite sides of a first capacitor pad 31 in the embodiment.

A first power supply pad 31a and a third power supply pad 33a are connected to each other through a third wire 43, and a first ground pad 31b and a third ground pad 33b are connected to each other through a fourth wire 44.

As similar in the first embodiment, the first power supply pad 31a and the first ground pad 31b are connected to first vias 51 and second vias 52 at positions thereunder.

Such plan layout of the capacitor pads 31 to 33 may allow the vias 51, 52 to be provided at positions farther away from the semiconductor element 40 than in the first embodiment. The embodiment thus has practical benefits when wires are densely arranged in a region near the semiconductor element 40 and the vias 51, 52 may not be formed in the region.

In addition, as described in the first embodiment, the provision of the three capacitor pads 31 to 33 may allow the values of an $ESL_{v1}$, an $ESR_{v1}$, an $ESL_{g1}$ and an $ESR_{g1}$ in the case where the capacitor 39 is mounted on the capacitor pad to be changed depending on which one of the capacitor pads 31 to 33 is selected.

Changing the values of the $ESL_{v1}$, the $ESR_{v1}$, the $ESL_{g1}$ and the $ESR_{g1}$ may change the value of the parallel resonance frequency from one of the values of parallel resonance frequencies $h_1$ to $h_3$ to another depending on which one of the capacitor pads 31 to 33 is selected.

However, if the wire length of a first wire 41 and that of the third wire 43 are the same, or if the wire length of a second wire 42 and that of the fourth wire 44 are the same, the values of the $ESL_{v1}$, the $ESR_{v1}$, the $ESL_{g1}$ and the $ESR_{g1}$ are changed only slightly, and differences among the values of the parallel resonance frequencies $h_1$ to $h_3$ are small.

In this respect, in the embodiment, the wire width $W_1$ of the first wire 41 is made larger than the wire width $W_3$ of the third wire 43, and the wire width $W_2$ of the second wire 42 is made larger than the wire width $W_4$ of the fourth wire 44. Thus, the wire widths $W_1$ to $W_4$ are made different from one another.

The larger the wire width is, the smaller the resistance of the wire is, and thus the $ESR_{v1}$ and the $ESR_{g1}$ become smaller. Accordingly, the values of the $ESR_{v1}$ and the $ESR_{g1}$ may be made to differ greatly depending on which one of the capacitor pads 31 to 33 the capacitor 39 is mounted on. Hence, the values of the parallel resonance frequencies $h_1$ to $h_3$ may be made to differ greatly from one another.

As a result, even when one of the parallel resonance frequencies $h_1$ to $h_3$ is close to the operating frequency F of the semiconductor element 40, by selecting a different one of the parallel resonance frequencies, the difference between the parallel resonance frequency and the operating frequency F may be made larger. Thus, occurrence of large noise in the signal of a semiconductor device may be suppressed.

In the above description, making the wire widths $W_1$ to $W_4$ different from each other may allow the values of the $ESL_{v1}$, the $ESR_{v1}$, the $ESL_{g1}$ and the $ESR_{g1}$ to be changed depending on which one of the capacitor pads 31 to 33 is selected. However, the embodiment is not limited to this.

Figure 28:
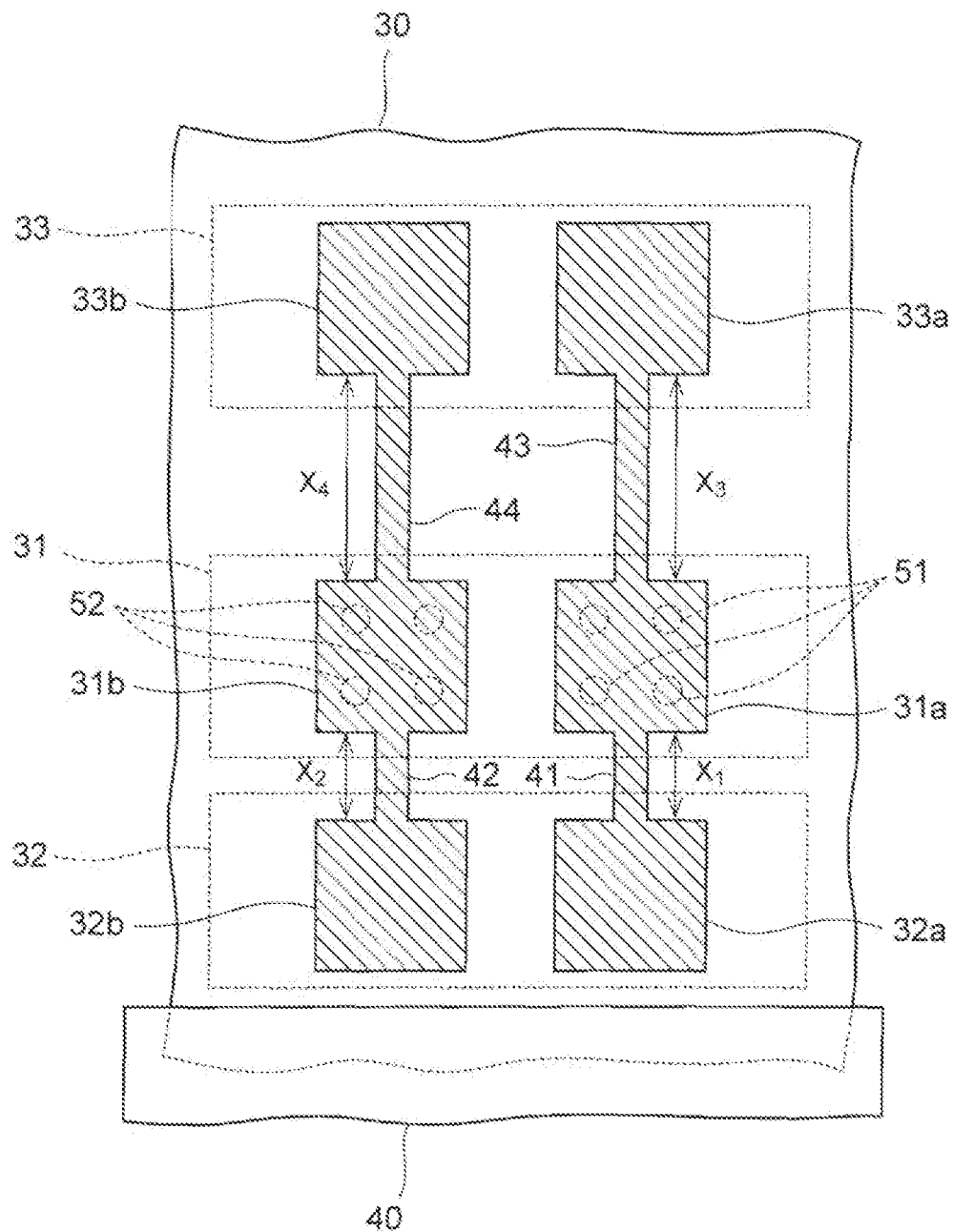
FIG. 28 is an enlarged plan view of first to third capacitor pads included in a semiconductor device substrate according to another example of the second embodiment.

FIG. 28 is an enlarged plan view of the first to third capacitor pads 31 to 33 for explaining another example of the embodiment.

In this example, the wire length $X_3$ of the third wire 43 is made larger than the wire length $X_1$ of the first wire 41, and the wire length $X_4$ of the fourth wire 44 is made larger than the wire length $X_2$ of the second wire 42.

The larger the wire length is, the larger the resistance of the wire is, and thus the $ESL_{v1}$, the $ESR_{v1}$, the $ESL_{g1}$ and the $ESR_{g1}$ become larger. Accordingly, the values of the $ESL_{v1}$, the $ESR_{v1}$, the $ESL_{g1}$ and the $ESR_{g1}$ may be made to differ greatly depending on which one of the capacitor pads 31 to 33 the capacitor 39 is mounted on. Hence, the values of the parallel resonance frequencies $h_1$ to $h_3$ may be made to differ greatly from one another.

Next, the simulation result of the embodiment will be described.

FIG. 29 illustrates impedance curves of the semiconductor device substrate 30 obtained from the simulation.

Note that, the plane size and the layered structure of the semiconductor device substrate 30 used in the simulation are the same as the one used in the simulation of the first embodiment (FIG. 24).

In this simulation, the wire widths $W_4$, $W_2$ of the respective first wire 41 and the second wire 42 are both 100 μm, and the wire widths $W_3$ $W_4$ of the respective third wire 43 and the fourth wire 44 are both 20 μm.

The wire lengths $X_1$ to $X_4$ are all 2.8 mm.

Moreover, the plane shape of each of the pads 31a to 33a and 31b to 33b is a rectangle in which the length $D_1$ of each of the shorter sides is 1.2 mm and the length $D_2$ of each of the longer sides is 1.4 mm.

In FIG. 29, m1 and m2 are coordinate points of the parallel resonance frequency (X) and the peak height thereof (Y) in the case where the capacitor 39 is mounted on the second capacitor pad 32 and the third capacitor pad 33, respectively.

Further, m3 and m4 are coordinate points of the first resonance frequency (X) and the impedance value thereof (Y) in the case where the capacitor 39 is mounted on the second capacitor pad 32 and the third capacitor pad 33, respectively.

As indicated by the coordinate points m1, m2 of FIG. 29, it becomes apparent that making the wire widths $W_1$ to $W_4$ different from one another as described above may allow the parallel resonance frequency to be changed depending on which one of the second capacitor pad 32 and the third capacitor pad 33 the capacitor 39 is mounted on.

Third Embodiment

Figure 30:
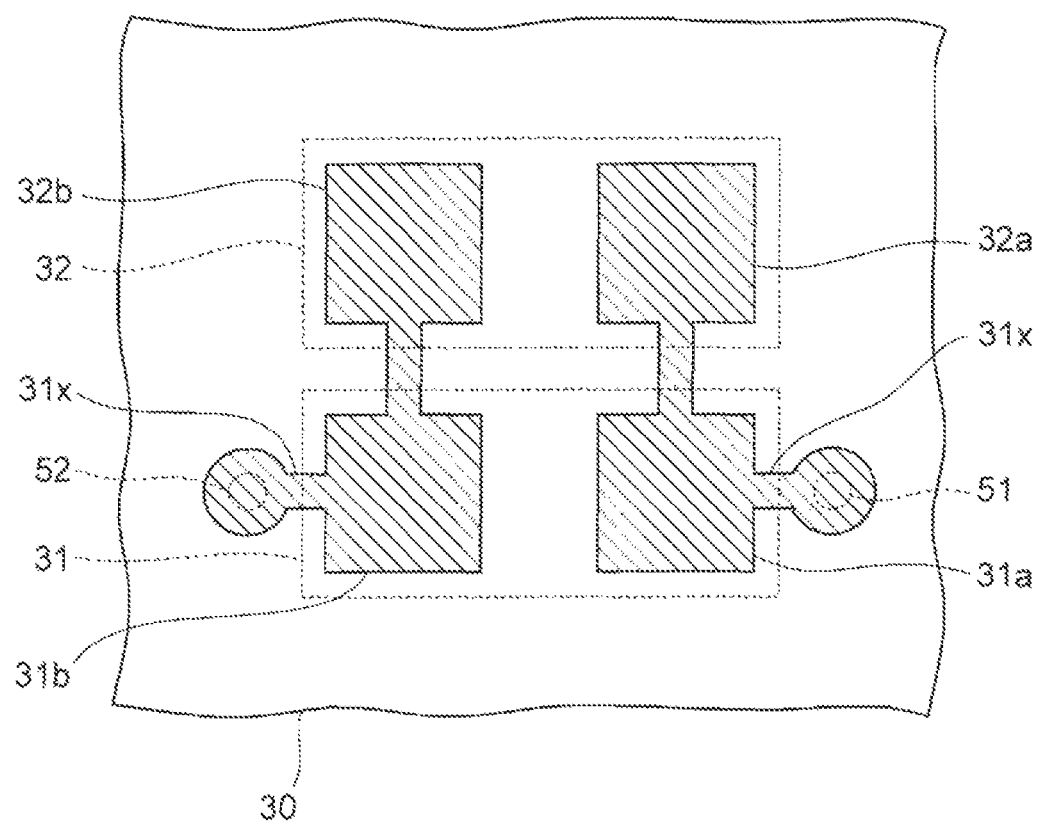
FIG. 30 is an enlarged plan view of first and second capacitor pads included in a semiconductor device substrate according to a third embodiment.

FIG. 30 is an enlarged plan view of first and second capacitor pads 31, 32 included in a semiconductor device substrate 30 according to the embodiment. Note that, elements which are the same as those described in the first embodiment are denoted by the same reference numerals in FIG. 30, and descriptions thereof are omitted below.

As illustrated in FIG. 12, the first vias 51 and the second vias 52 are provided under the first power supply pad 31a and the first ground pad 31b in the first embodiment.

However, a case is conceivable where the vias 51, 52 may not be formed under the power supply pad 31a and the ground pad 31b due to restrictions in wiring layout.

In such case, as illustrated in FIG. 30, it is preferable to provide an extension portion 31x beside each of a first power supply pad 31a and a first ground pad 31b, and form vias 51, 52 under the extension portions 31x.

Such configuration may prevent a case where a wire between the first power supply pad 31a and the first via 51 and a wire between the first ground pad 31b and the second via 52 are designed to be long due to restrictions in wiring layout. Thus, increase in inductance due to increase in wire length may be prevented, and the effect of preventing fluctuation of the power supply voltage by the capacitor 39 may be maintained.

Note that, in FIG. 30, the third capacitor pad 33 described in the first embodiment is omitted. However, the third capacitor pad 33 may be connected to the second capacitor pad 32 as in the first embodiment.

Fourth Embodiment

Figure 31:
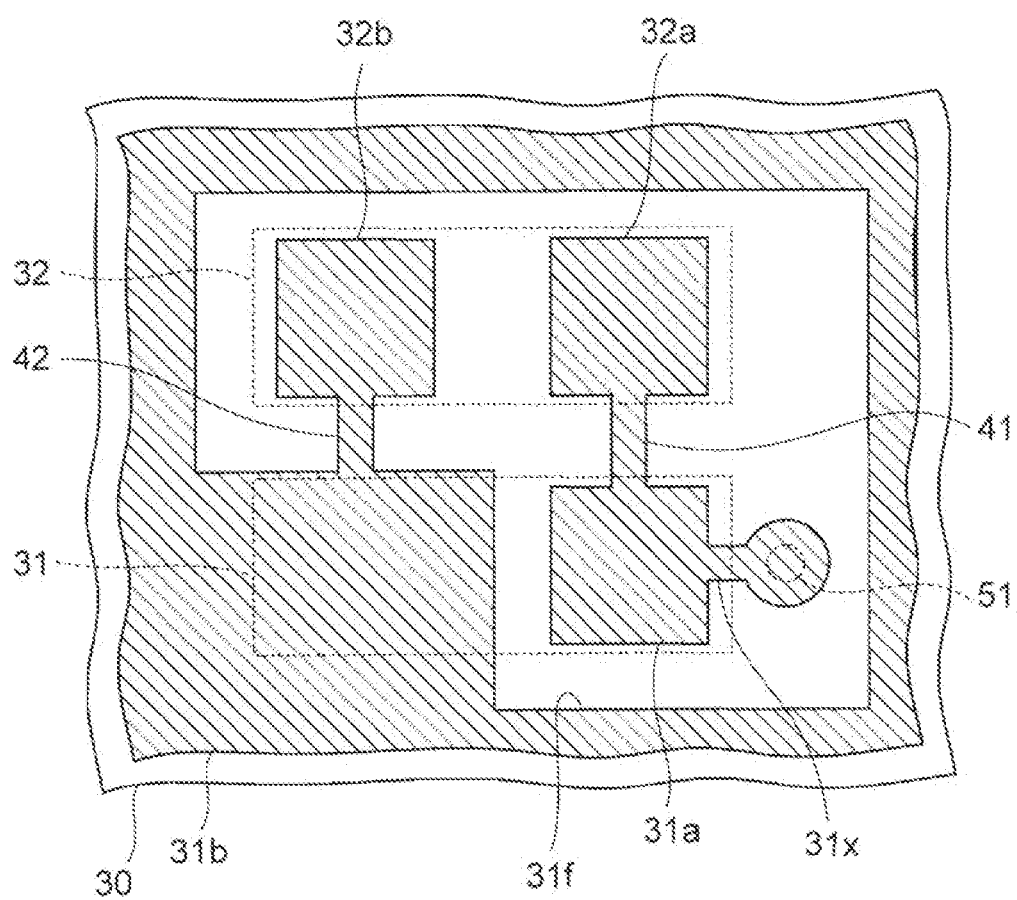
FIG. 31 is an enlarged plan view (1) of first and second capacitor pads included in a semiconductor device substrate according to a fourth embodiment.

FIG. 31 is an enlarged plan view of first and second capacitor pads 31, 32 included in a semiconductor device substrate 30 according to the embodiment. Note that, elements which are the same as those described in the first embodiment are denoted by the same reference numerals in FIG. 31, and descriptions thereof are omitted below.

As illustrated in FIG. 31, a first ground pad 31b is formed to solidly cover almost the entire surface of the semiconductor device substrate 30 in the embodiment. Then, an opening 31f is provided in the first ground pad 31b, and first and second power supply pads 31a, 32a, and a second ground pad 32b are provided in the opening 31f.

Figure 32:
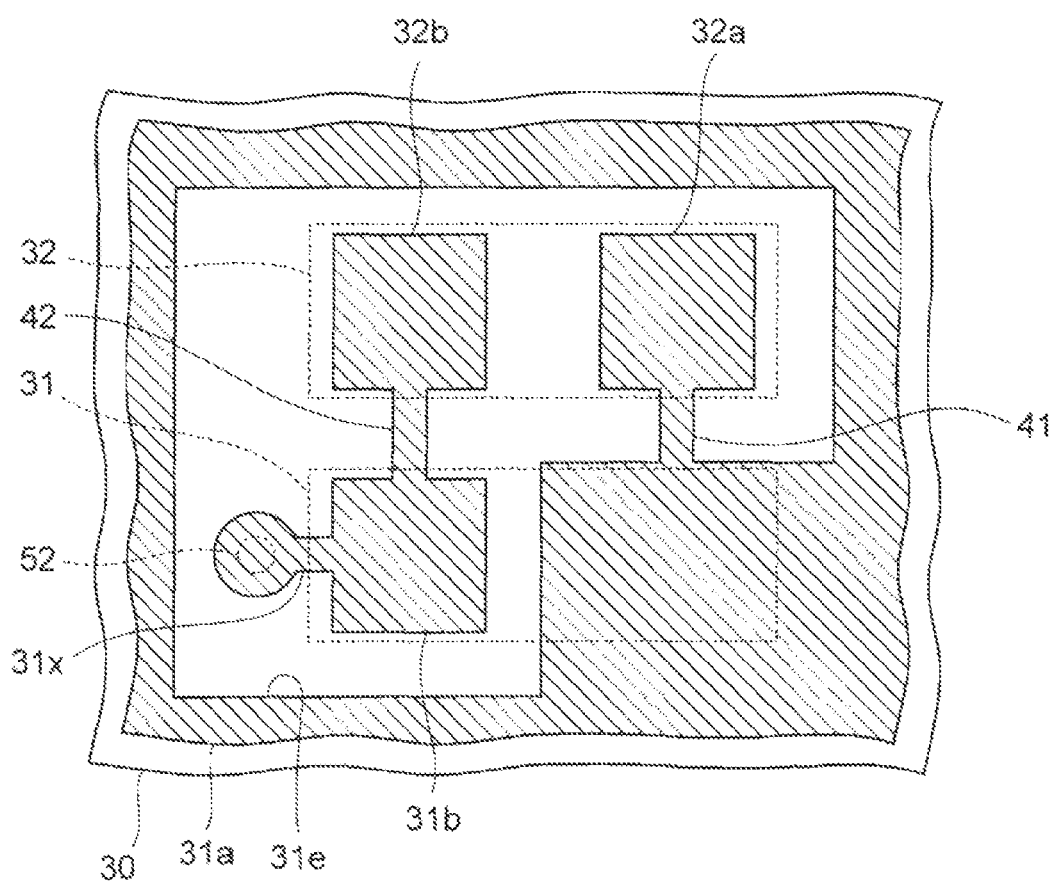
FIG. 32 is an enlarged plan view (2) of the first and second capacitor pads included in the semiconductor device substrate according to the fourth embodiment.

Note that, the first power supply pad 31a may be solidly formed as illustrated in an enlarged plan view of FIG. 32, instead of the first ground pad 31b formed as described above.

In such case, an opening 30e is provided in the first power supply pad 31a, and the first and second ground pads 31b, 32b and the second power supply pad 32a are provided in the opening 30e.

Fifth Embodiment

Figure 33:
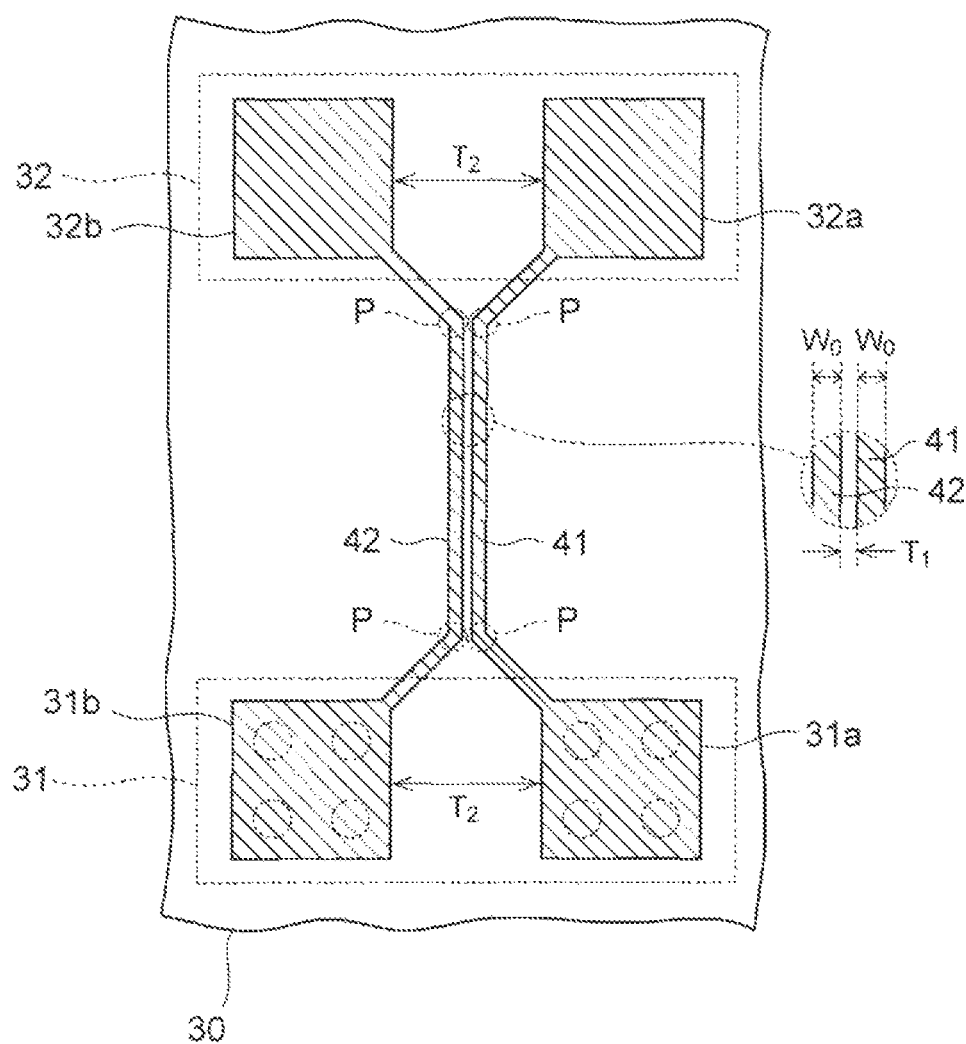
FIG. 33 is an enlarged plan view of first and second capacitor pads included in a semiconductor device substrate according to a fifth embodiment.

FIG. 33 is an enlarged plan view of first and second capacitor pads 31, 32 included in a semiconductor device substrate 30 according to the embodiment. Note that, elements which are the same as those described in the first embodiment are denoted by the same reference numerals in FIG. 33, and descriptions thereof are omitted below.

As illustrated in FIG. 33, bent portions P are provided in each of a first wire 41 and a second wire 42 in the embodiment.

This configuration makes a gap $T_1$ between the first wire 41 and the second wire 42 smaller than a gap $T_2$ between a first power supply pad 31a and a first ground pad 31b and a gap $T_2$ between a second power supply pad 32a and a second ground pad 32b.

Such configuration achieves stronger coupling of the wires 41, 42 than a case where no bent portion P is provided in the wires 41, 42. Accordingly, effective inductances in the wires 41, 42 are reduced, and the $ESL_{v1}$ and $ESL_{g1}$ described above may be reduced.

Figure 34:
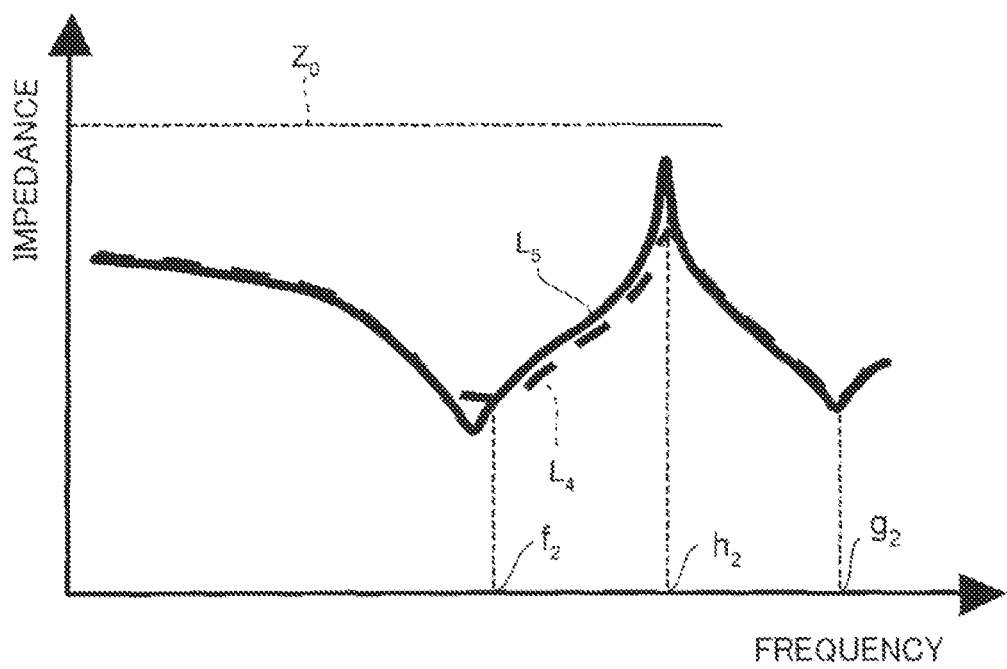
FIG. 34 is a graph illustrating an impedance curve in a case where a capacitor is mounted on the second capacitor pad of the semiconductor device substrate according to the fifth embodiment.

FIG. 34 is a graph illustrating an impedance curve $L_4$ of the semiconductor device substrate 30 in a case where a capacitor is mounted on the second capacitor pad 32.

Note that, in FIG. 34, an impedance curve $L_5$ is also illustrated for comparison, the impedance curve $L_5$ being a curve in a case where no bent portion P described above is provided in the first wire 41 and the second wire 42, and the first wire 41 and the second wire 42 each have a straight shape in a plan layout.

A first resonance frequency $f_2$ and a second resonance frequency $g_2$ exist in the impedance curve $L_4$, and there is a parallel resonance frequency $h_2$ between these two frequencies. It is preferable that the height of the peak of the parallel resonance frequency $h_2$ is made as small as possible so that the peak is away from a target impedance $Z_0$.

The inventors of the present application find that, by coupling the wires 41, 42 as described above to reduce the $ESL_{v1}$ and the $ESL_{g1}$, the height of the peak of the parallel resonance frequency $h_2$ is made smaller than the case of providing no bent portion P in the wires 41, 42.

Figure 35:
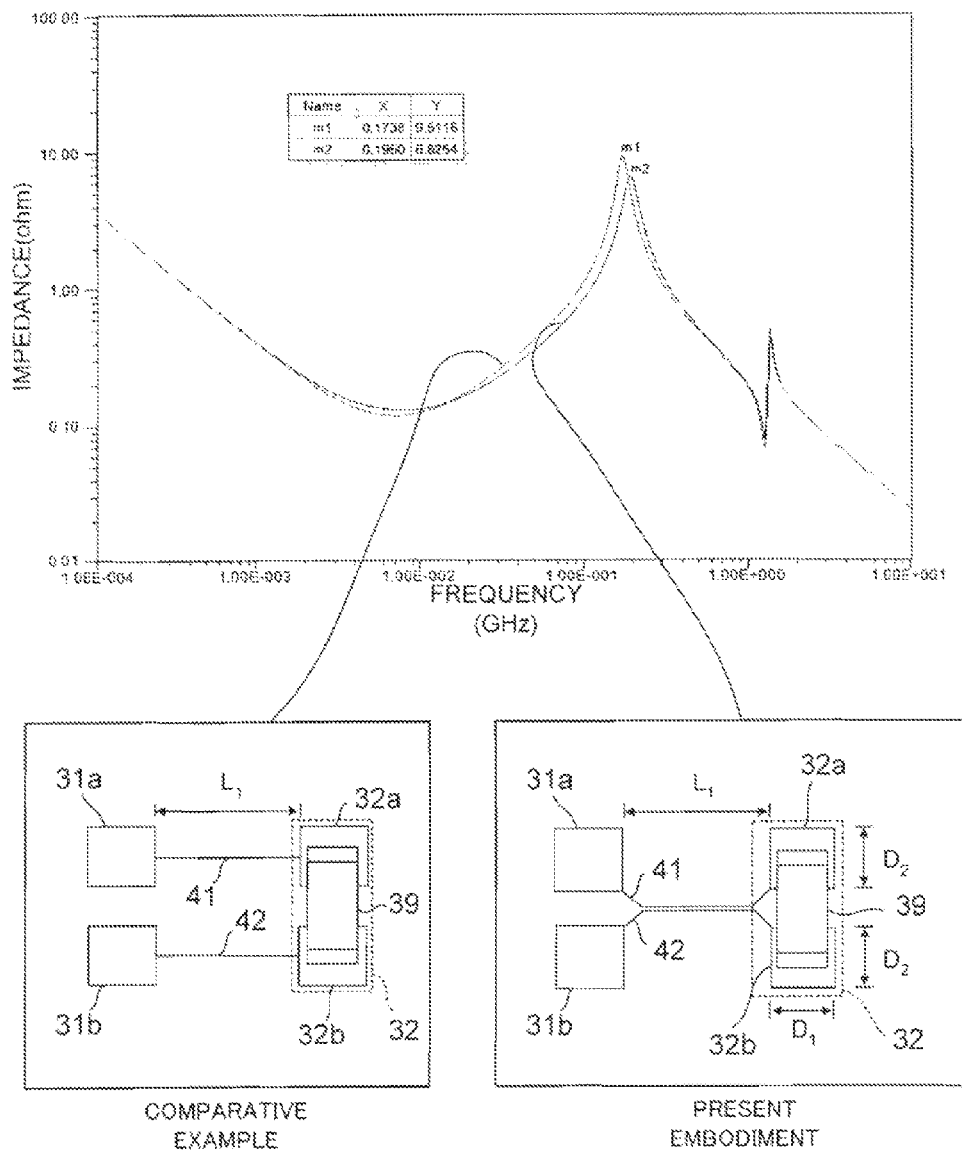
FIG. 35 is a view illustrating the result of a simulation performed for the semiconductor device substrate according to the fifth embodiment.

FIG. 35 is a view illustrating the result of a simulation performed to confirm this fact.

In this simulation, an impedance curve is calculated for each of the embodiment described above and a comparative example.

Among these, in the embodiment, the first wire 41 and the second wire 42 are arranged close to each other by being bent as described above. The gap $T_1$ between the first wire 41 and the second wire 42 is 20 μm.

Meanwhile, in the comparative example, the wires 41, 42 are not bent as described above, and have a straight plane shape.

Note that, in both of the embodiment and the comparative example, the plane shape of each of the power supply pads 31a, 32a and the ground pads 31b, 32b is a rectangular shape in which the length $D_1$ of each of the shorter sides is 1.2 mm and the length $D_2$ of each of the longer sides is 1.4 mm.

Moreover, a gap $L_1$ between the first power supply pad 31a and the second power supply pad 32a is 2.8 mm, and the width $W_0$ (see FIG. 33) of each of the wires 41, 42 is 20 μm.

In FIG. 35, m1 and m2 are coordinate points of the parallel resonance frequency (X) and the peak height thereof (Y) in the case where the capacitor 39 is mounted on the second capacitor pad 32 in the comparative example and the embodiment, respectively.

By comparing m1 and m2, it is confirmed that arranging the wires 41, 42 close to each other as in the embodiment makes the peak height (Y) of the parallel resonance frequency (X) lower than that in the comparative example.

Such an effect may be significant particularly when a ratio $(T_1/W_0)$ of the gap $T_1$ between the wires 41, 42 to the width $W_0$ of each of the wires 41, 42 is 2 or less.

Sixth Embodiment

In the embodiment, descriptions are given of a method of manufacturing a semiconductor device including the semiconductor device substrate 30 described in the first embodiment.

Figure 36:
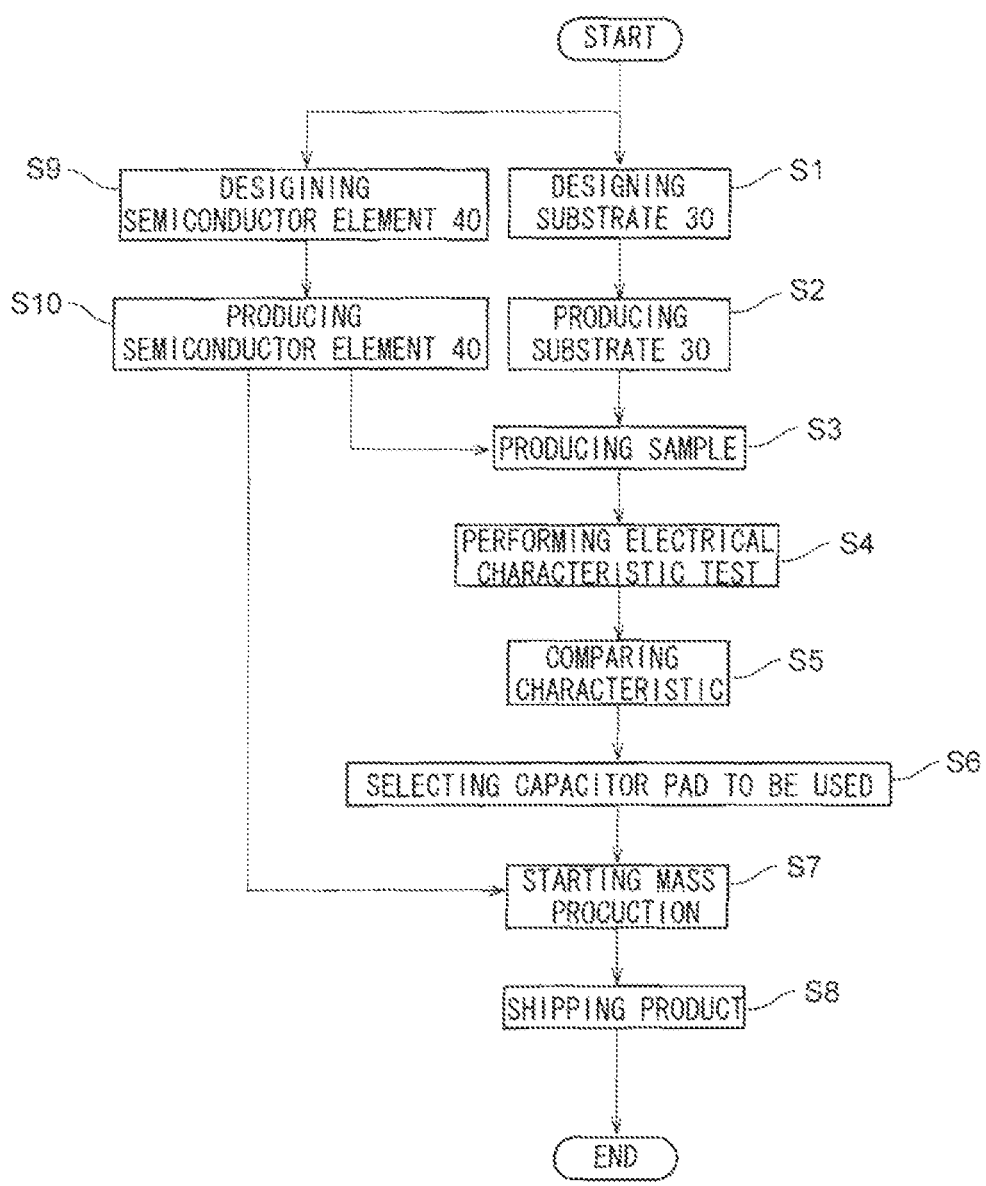
FIG. 36 is a flowchart for explaining a method of manufacturing a semiconductor device according to a sixth embodiment.

FIG. 36 is an example of a flowchart for explaining a method of manufacturing a semiconductor device according to the embodiment.

First, in step S1, the semiconductor device substrate 30 (see FIG. 11) is designed, and the semiconductor device substrate 30 is actually produced in step S2.

In parallel with steps S1, S2, a semiconductor element 40 is designed in step S9, and the semiconductor element 40 is produced in step S10.

Next, the processing proceeds to step S3, and samples are each produced by mounting the semiconductor element 40 produced in step S10 and capacitors 39 on the semiconductor device substrate 30.

For example, three samples are produced respectively having configurations differing in the positions of the capacitors 39 on the semiconductor device substrate 30.

Among the three samples, one is a sample in which the capacitors 39 are mounted on first capacitor pads 31. The other two samples are a sample in which the capacitors 39 are mounted on second capacitor pads 32, and a sample in which the capacitors 39 are mounted on third capacitor pads 33.

Next, the processing proceeds to step S4, and an electrical characteristic test is performed for each of the three samples.

In the electrical characteristic test, the size of noise in a power supply voltage, a signal waveform, and the like are inspected, for example.

Thereafter, the processing proceeds to step S5, and the characteristics of the three samples are compared based on the results of the electrical characteristic tests performed in step S4. For example, the sizes of the noise in the power supply voltages are compared among the three samples.

Note that, steps S4, S5 may not be performed in-house, but by a customer to which the products are shipped.

Next, the processing proceeds to step S6, and the sample with the smallest noise in the power supply voltage is selected based on the comparison performed in step S5. Then, among the first to third capacitor pads 31 to 33, the same capacitor pad as one used in the selected sample is selected as the capacitor pad on which the capacitor 39 is to be mounted in mass production.

Then, the processing proceeds to step S7 and the mass production of the semiconductor device is started. In the mass production, the semiconductor element 40 produced in step S10 is mounted on the semiconductor device substrate 30 for a product, and the capacitors 39 are mounted on the capacitor pads selected in step S6.

Thereafter, the processing proceeds to step S8, and the finished semiconductor device is shipped.

Thus, the basic steps of the method of manufacturing a semiconductor device of the embodiment are completed.

In the embodiment described above, the capacitors 39 are actually mounted on the first to third capacitor pads 31 to 33, and such a capacitor pad that the power supply noise is the smallest is selected from these capacitor pads.

Other Embodiment

As illustrated in FIG. 14, the ground pads 31b to 33b are formed in the uppermost layer of the multi-layer wiring layer 57 in the first embodiment.

Figure 37:
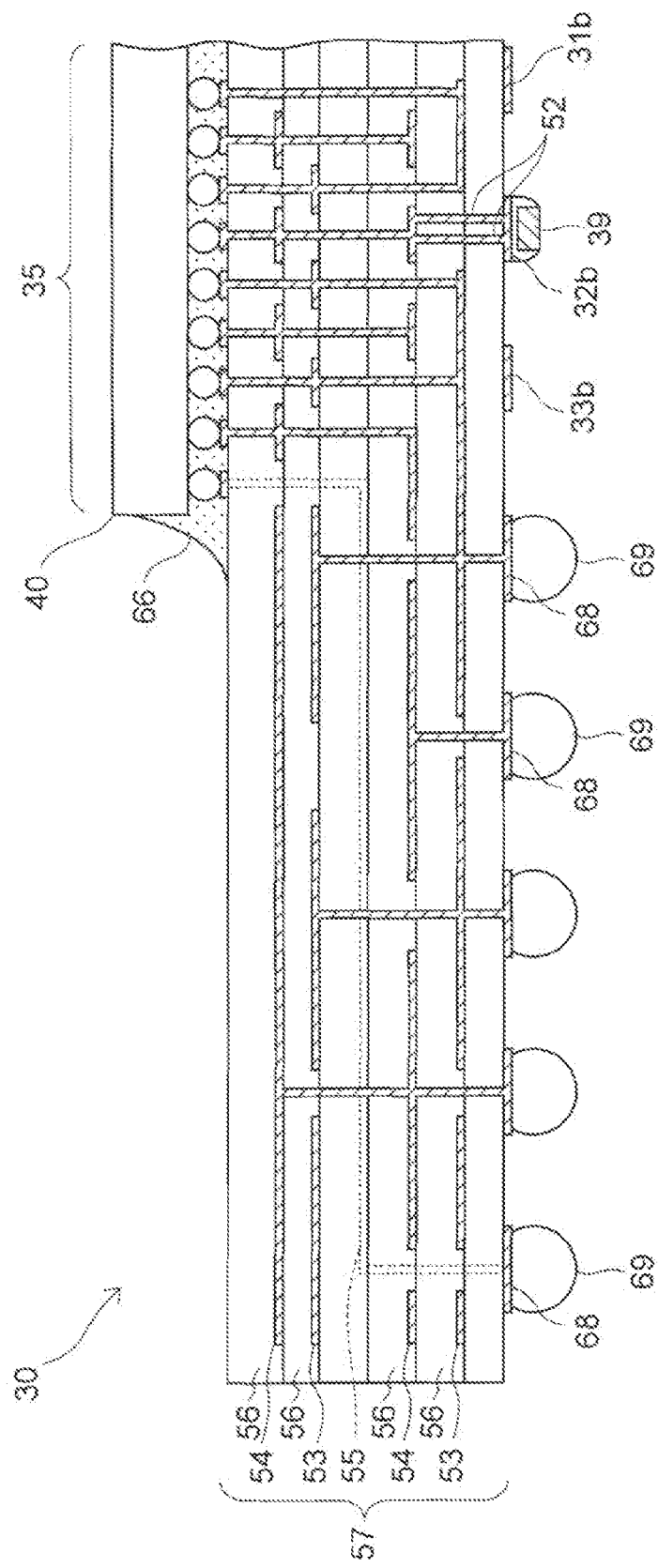
FIG. 37 is an enlarged cross-sectional view of a main portion of a semiconductor device according to another embodiment.

Portions where the power supply pads 31a to 33a and the ground pads 31b to 33b are formed are not limited to those described above, and the power supply pads 31a to 33a and the ground pads 31b to 33b may be formed in the lowermost layer of the multi-layer wiring layer 57 as illustrated in FIG. 37.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device substrate comprising:
a multi-layer wiring layer;
a first capacitor pad which is provided on any one of an uppermost layer and a lowermost layer of the multi-layer wiring layer, and which comprises a first power supply pad connected to a power supply layer of the multi-layer wiring layer through a first via and a first ground pad connected to a ground layer of the multi-layer wiring layer through a second via; and
a second capacitor pad which is provided on any one of the uppermost layer and the lowermost layer of the multi-layer wiring layer, and which comprises a second power supply pad connected to the first power supply pad through a first wire and a second ground pad connected to the first ground pad through a second wire,
wherein the first wire is formed above the same layer as the first power supply pad and the second power supply pad, and the second wire is formed above the same layer as the first ground pad and the second ground pad.

2. The semiconductor device substrate according to claim 1, wherein a length of the first wire is equal to a length of the second wire.

3. The semiconductor device substrate according to claim 1, wherein a plurality of the first capacitor pads are provided around a position where a semiconductor element is to be mounted.

4. The semiconductor device substrate according to claim 3, wherein the second capacitor pad is provided for each of the plurality of first capacitor pads.

5. The semiconductor device substrate according to claim 1, further comprising a third capacitor pad which is provided on any one of the uppermost layer and the lowermost layer of the multi-layer wiring layer, and which comprises a third power supply pad connected to the second power supply pad through a third wire and a third ground pad connected to the second ground pad through a fourth wire.

6. The semiconductor device substrate according to claim 5, wherein
a length of the first wire is equal to a length of the third wire, and
a length of the second wire is equal to a length of the fourth wire.

7. The semiconductor device substrate according to claim 1, further comprising a third capacitor pad which is provided on any one of the uppermost layer and the lowermost layer of the multi-layer wiring layer, and which comprises a third power supply pad connected to the first power supply pad through a third wire and a third ground pad connected to the first ground pad through a fourth wire.

8. The semiconductor device substrate according to claim 7, wherein
a width of the first wire is different from a width of the third wire, and
a width of the second wire is different from a width of the fourth wire.

9. The semiconductor device substrate according to claim 7, wherein
a length of the first wire is different from a length of the third wire, and
a length of the second wire is different from a length of the fourth wire.

10. The semiconductor device substrate according to claim 1, wherein a gap between the first wire and the second wire is smaller than a gap between the first power supply pad and the first ground pad.

11. The semiconductor device substrate according to claim 1, wherein
a plurality of the first vias are provided under the first power supply pad, and
a plurality of the second vias are provided under the first ground pad.

12. The semiconductor device substrate according to claim 1, wherein
the first via is provided beside the first power supply pad, and
the second via is provided beside the first ground pad.

13. The semiconductor device substrate according to claim 1, wherein the first ground pad has an opening in which the first power supply pad and the second capacitor pad are contained.

14. The semiconductor device substrate according to claim 1, wherein the first power supply pad has an opening in which the first ground pad and the second capacitor pad are contained.

15. A semiconductor device comprising:
a semiconductor device substrate, the semiconductor device substrate comprising:
a multi-layer wiring layer,
a first capacitor pad which is provided on an uppermost layer of the multi-layer wiring layer, and which comprises a first power supply pad connected to a power supply layer of the multi-layer wiring layer through a first via and a first ground pad connected to a ground layer of the multi-layer wiring layer through a second via, and
a second capacitor pad which is provided on the uppermost layer of the multi-layer wiring layer, and which comprises a second power supply pad connected to the first power supply pad through a first wire and a second ground pad connected to the first ground pad through a second wire,
wherein the first wire is formed above the same layer as the first power supply pad and the second power supply pad, and the second wire is formed above the same layer as the first ground pad and the second ground pad;
a capacitor connected to any one of the first capacitor pad and the second capacitor pad; and
a semiconductor element disposed above the semiconductor device substrate.

16. The semiconductor device according to claim 15, wherein a length of the first wire is equal to a length of the second wire.

17. The semiconductor device according to claim 15, wherein a plurality of the first capacitor pads are provided around the semiconductor element.

18. The semiconductor device according to claim 17, wherein the second capacitor pad is provided for each of the plurality of first capacitor pads.

19. The semiconductor device according to claim 15, wherein the semiconductor device substrate further comprises a third capacitor pad which is provided on the uppermost layer of the multi-layer wiring layer, and which comprises a third power supply pad connected to the second power supply pad through a third wire and a third ground pad connected to the second ground pad through a fourth wire.

20. A semiconductor device comprising:
a semiconductor device substrate, the semiconductor device substrate comprising:
a multi-layer wiring layer,
a first capacitor pad which is provided on an uppermost layer of the multi-layer wiring layer, and which comprises a first power supply pad connected to a power supply layer of the multi-layer wiring layer through a first via and a first ground pad connected to a ground layer of the multi-layer wiring layer through a second via,
a second capacitor pad which is provided on the uppermost layer of the multi-layer wiring layer, and which comprises a second power supply pad connected to the first power supply pad through a first wire and a second ground pad connected to the first ground pad through a second wire, and
a third capacitor pad which is provided on the uppermost layer of the multi-layer wiring layer, and which comprises a third power supply pad connected to the second power supply pad through a third wire and a third ground pad connected to the second ground pad through a fourth wire,
wherein the first wire and the third wire are formed above the same layer as the first power supply pad, the second power supply pad and the third power supply pad, and the second wire and the fourth wire are formed above the same layer as the first ground pad, the second ground pad and the third ground pad;
a capacitor connected to any one of the first capacitor pad, the second capacitor pad, and the third capacitor pad; and
a semiconductor element disposed above the semiconductor device substrate.

* * * * *